(12) United States Patent
Muraki et al.

(10) Patent No.: US 11,239,046 B2
(45) Date of Patent: Feb. 1, 2022

(54) CHARGED PARTICLE BEAM APPARATUS

(71) Applicant: HITACHI HIGH-TECH SCIENCE CORPORATION, Tokyo (JP)

(72) Inventors: Ayana Muraki, Tokyo (JP); Atsushi Uemoto, Tokyo (JP); Tatsuya Asahata, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/030,992

(22) Filed: Sep. 24, 2020

(65) Prior Publication Data

US 2021/0090851 A1 Mar. 25, 2021

(30) Foreign Application Priority Data

Sep. 25, 2019 (JP) .............................. JP2019-173889

(51) Int. Cl.
*H01J 37/20* (2006.01)
*H01J 37/26* (2006.01)
(Continued)

(52) U.S. Cl.
CPC ............ *H01J 37/20* (2013.01); *H01J 37/222* (2013.01); *H01J 37/26* (2013.01);
(Continued)

(58) Field of Classification Search
CPC .......... H01J 37/20; H01J 37/26; H01J 37/222; H01J 37/3005; H01J 37/3045; H01J 2237/31745; H01J 37/31; H01J 37/304; H01J 37/244; H01J 2237/208; H01J 2237/28; H01J 2237/31749; H01J 2237/20; H01J 2237/26; G01N 1/286; G01N 2001/2873
(Continued)

(56) References Cited

U.S. PATENT DOCUMENTS 9,620,333 B2 * 4/2017 Tomimatsu ............. H01J 37/20
2017/0278664 A1 * 9/2017 Sato .................... H01J 37/3056
(Continued)

FOREIGN PATENT DOCUMENTS

JP 2016-157671 A 9/2016
JP 2019-102138 A 6/2019

*Primary Examiner* — Kiet T Nguyen
(74) *Attorney, Agent, or Firm* — Holland & Hart LLP

(57) ABSTRACT

To stabilize automated MS, provided is a charged particle beam apparatus, which is configured to automatically fabricate a sample piece from a sample, the charged particle beam apparatus including: a charged particle beam irradiation optical system configured to radiate a charged particle beam; a sample stage configured to move the sample that is placed on the sample stage; a sample piece transportation unit configured to hold and convey the sample piece separated and extracted from the sample; a holder fixing base configured to hold a sample piece holder to which the sample piece is transported; and a computer configured to perform control of a position with respect to a target, based on: a result of second determination about the position, which is executed depending on a result of first determination about the position; and information including an image that is obtained by irradiation with the charged particle beam.

3 Claims, 20 Drawing Sheets

(51) Int. Cl.
  *H01J 37/22* (2006.01)
  *H01J 37/304* (2006.01)
  *H01J 37/30* (2006.01)

(52) U.S. Cl.
  CPC ...... *H01J 37/3005* (2013.01); *H01J 37/3045* (2013.01); *H01J 2237/31745* (2013.01)

(58) Field of Classification Search
  USPC ........................................ 250/306, 307, 310
  See application file for complete search history.

(56) References Cited

U.S. PATENT DOCUMENTS

2018/0204704 A1* 7/2018 Suzuki ............... G01N 23/2204
2019/0157037 A1* 5/2019 Tomimatsu ......... H01J 37/3056
2019/0304745 A1* 10/2019 Suzuki ............... H01J 37/3023

* cited by examiner

CHARGED PARTICLE BEAM APPARATUS

The present application claims priorities to Japanese Patent Application No. 2019-173889, filed Sep. 25, 2019 and Japanese Patent Application No. 2020-047470, filed Mar. 18, 2020, the entire contents of each of which are incorporated herein for all purposes by this reference.

1. FIELD OF THE INVENTION

The present invention relates to a charged particle beam apparatus.

2. DESCRIPTION OF THE RELATED ART

Hitherto, there has been known an apparatus in which a sample piece fabricated by irradiating a sample with a charged particle beam that is made of electrons or ions is extracted and processed into a shape suitable for observation, analysis, measurement, and other steps that use a transmission electron microscope (TEM) or a similar instrument (Japanese Patent Application Laid-open No. 2019-102138). For observation with a transmission electron microscope, the apparatus described in Japanese Patent Application Laid-open No. 2019-102138 performs so-called micro-sampling (MS) in which a minute thin-film sample piece is extracted from a sample that is an observation target, and fixed to a sample holder to prepare a TEM sample.

A known charged particle beam apparatus uses template matching in the fabrication of a thin sample piece for TEM observation to detect a target, for example, a tip of a microprobe, a pick-up position of the thin sample piece, or a pillar end on a mesh holder (Japanese Patent Application Laid-open No. 2016-157671). In the charged particle beam apparatus described in Japanese Patent Application Laid-open No. 2016-157671, position control is performed with respect to the target based on a template created from an image of the target that is obtained by irradiation with a charged particle beam, and on position information obtained from the image of the target. This enables automatic execution of MS (automated MS) in the charged particle beam apparatus described in Japanese Patent Application Laid-open No. 2016-157671.

In the charged particle beam apparatus described in Japanese Patent Application Laid-open No. 2016-157671, template matching sometimes fails when there is a difference in contrast or focus between an image of a target that is obtained by irradiation with a charged particle beam and a template image, or when an image of a target and a template image differ from each other in the surface shape of the target (a surface shape difference caused by the adhesion of a foreign material is included). Failed template matching halts automated MS in the charged particle beam apparatus described in Japanese Patent Application Laid-open No. 2016-157671.

In the related art, automated MS has thus been not stable enough, and stabilization of automated MS for improved throughput is desired.

SUMMARY OF THE INVENTION

The present invention has been made in view of the above-mentioned circumstances.
The present invention adopts the following embodiments.
(1) According to at least one embodiment of the present invention, there is provided a charged particle beam apparatus, which is configured to automatically fabricate a sample piece from a sample, the charged particle beam apparatus including: a charged particle beam irradiation optical system configured to radiate a charged particle beam; a sample stage configured to move the sample that is placed on the sample stage; a sample piece transportation unit configured to hold and convey the sample piece separated and extracted from the sample; a holder fixing base configured to hold a sample piece holder to which the sample piece is transported; and a computer configured to perform control of a position with respect to a target, based on: a result of second determination about the position, which is executed depending on a result of first determination about the position; and information including an image that is obtained by irradiation with the charged particle beam.

In the charged particle beam apparatus according to the embodiment described in Item (1) above, the position of a target is detectable based on the result of the second determination, which is executed depending on the result of the first determination, and automated MS is therefore stabilized.

When a failure to detect the position of a target halts automated MS in the related art, a user is required to deal with the situation each time automated MS comes to a halt, which invites a drop in throughput. In the charged particle beam apparatus according to the embodiment described in Item (1) above, the position of a target is detectable based on the result of the second determination even when the first determination fails, which improves the rate of success of position detection and enables the charged particle beam apparatus to recover in the event of a template matching failure.

(2) In the charged particle beam apparatus according to Item (1) described above, the first determination is determination based on template matching that uses a template about the target, and the second determination is determination based on a model of machine learning in which second information including a second image of a second target is learned.

In the charged particle beam apparatus according to the embodiment described in Item (2) above, the position of a target is detectable from the result of determination based on a model of machine learning, which is executed depending on the result of template matching-based determination. Automated MS can therefore be stabilized based on template matching and on a machine learning model. In particular, the charged particle beam apparatus according to the embodiment described in Item (2) above can detect the position of a target based on a machine learning model irrespective of a failure at template matching.

(3) In the charged particle beam apparatus according to Item (1) or (2) described above, the computer is configured to select a type of determination for at least one of the first determination or the second determination, based on a result of third determination for selecting a type of determination.

In the charged particle beam apparatus according to the embodiment described in Item (3) above, a determination type (an appropriate image processing algorithm) to be used for the determination of the position of a target can be selected, and the precision of the detection of the target's position can accordingly be improved.

(4) In the charged particle beam apparatus according to any one of Items (1) to (3) described above, the computer is configured to perform control of the position based on: a result of fourth determination that is selected based on at least one of the result of the first determination or the result of the second determination; and the information including the image that is obtained by irradiation with the charged particle beam.

In the charged particle beam apparatus according to the embodiment described in Item (4) above, the position of a target is detectable based on the result of the fourth determination, which is selected based on at least one of the result of the first determination or the result of the second determination, and automated MS is therefore stabilized more than when the position of a target is detected based on the result of the second determination.

According to the present invention, automated micro-sampling is stabilized.

DESCRIPTION OF THE EMBODIMENTS

First Embodiment

Figure 1:
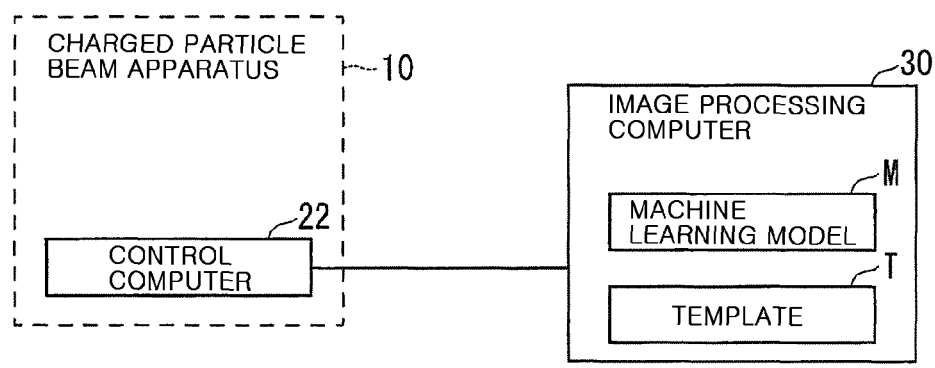
FIG. 1 is a diagram for illustrating an example of a configuration of a charged particle beam apparatus according to a first embodiment of the present invention, and a configuration of an image processing computer in the first embodiment.

Embodiments of the present invention are described below in detail with reference to the drawings. FIG. 1 is a diagram for illustrating an example of a configuration of a charged particle beam apparatus 10 according to a first embodiment of the present invention, and a configuration of an image processing computer 30 in the first embodiment. A control computer 22 included in the charged particle beam apparatus 10 obtains image data obtained by irradiation with a charged particle beam. The control computer 22 transmits or receives data to or from the image processing computer 30. The image processing computer 30 determines a target that is included in image data received from the control computer 22, based first on template matching using a template T. When the determination by template matching fails, the image processing computer 30 determines this target based on a machine learning model M. The control computer 22 performs position control with respect to the target based on the result of the determination by the image processing computer 30.

The control computer 22 is an example of a computer configured to execute, depending on the result of first determination (template matching) about a position with respect to a target, second determination (determination based on the machine learning model M) about the position with respect to the target, and perform position control with respect to a second target based on the result of the second determination and on information including an image obtained by irradiation with a charged particle beam.

The image processing computer 30 may be included in the charged particle beam apparatus 10.

The configuration of the charged particle beam apparatus 10 is described with reference to FIG. 2.

(Charged Particle Beam Apparatus)

Figure 2:
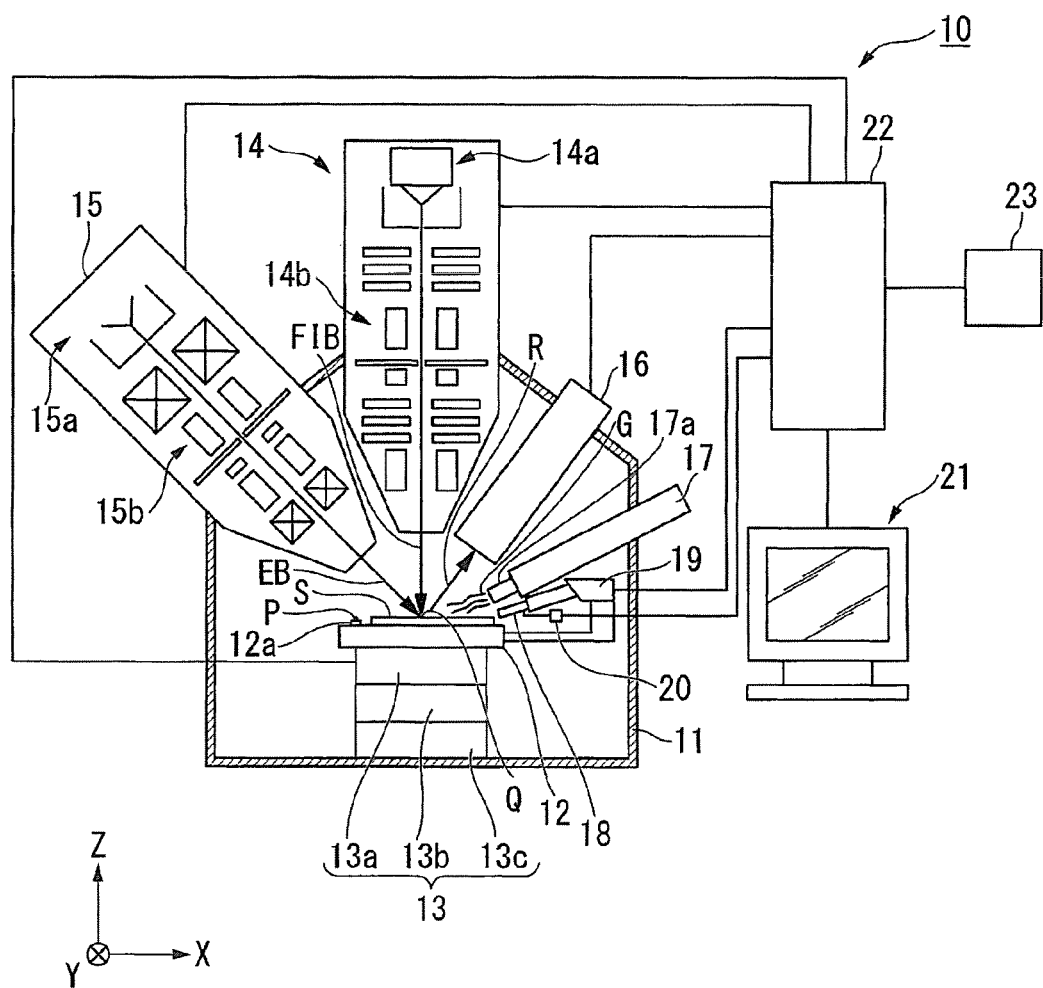
FIG. 2 is a diagram for illustrating an example of the configuration of the charged particle beam apparatus according to the first embodiment of the present invention.

FIG. 2 is a diagram for illustrating an example of the configuration of the charged particle beam apparatus 10 according to the first embodiment. The charged particle beam apparatus 10 includes a sample chamber 11, a sample stage 12, a stage driving mechanism 13, a focused ion beam irradiation optical system 14, an electron beam irradiation optical system 15, a detector 16, a gas supply unit 17, a needle 18, a needle driving mechanism 19, an absorption current detector 20, a display device 21, the control computer 22, and an input device 23.

The interior of the sample chamber 11 is kept in a vacuum state. The sample stage 12 fixes a sample S and a sample piece holder P inside the sample chamber 11. The sample stage 12 includes a holder fixing base 12a configured to hold the sample piece holder P. The holder fixing base 12a may be structured so that a plurality of sample piece holders P can be mounted thereto.

The stage driving mechanism 13 drives the sample stage 12. Here, the stage driving mechanism 13 is contained inside the sample chamber 11 under a state of being connected to the sample stage 12, and is configured to shift the sample stage 12 with respect to a predetermined axis in accordance with a control signal output from the control computer 22. The stage driving mechanism 13 includes a movement mechanism 13a configured to move the sample stage 12 at least along and in parallel to an X axis and a Y axis, which are parallel to a horizontal plane and orthogonal to each other, and a Z axis in a vertical direction, which is orthogonal to the X axis and the Y axis. The stage driving mechanism 13 includes a tilt mechanism 13b configured to tilt the sample stage 12 about the X axis or the Y axis, and a rotation mechanism 13c configured to rotate the sample stage 12 about the Z axis.

The focused ion beam irradiation optical system 14 irradiates an irradiation target within a predetermined irradiation area (namely, scanning range) in the sample chamber 11 with a focused ion beam (FIB). The focused ion beam irradiation optical system 14 irradiates the irradiation target, which includes the sample S placed on the sample stage 12, a sample piece Q, the needle 18 present in the irradiation area, and others, with a focused ion beam from above downward in the vertical direction.

The focused ion beam irradiation optical system 14 includes an ion source 14a configured to generate ions, and an ion optical system 14b configured to focus and deflect the ions extracted from the ion source 14a. The ion source 14a and the ion optical system 14b are controlled in accordance with a control signal output from the control computer 22 such that an irradiation position, irradiation conditions, and the like of the focused ion beam are controlled by the control computer 22.

The electron beam irradiation optical system 15 irradiates the irradiation target within a predetermined irradiation area in the sample chamber 11 with an electron beam (EB). The electron beam irradiation optical system 15 can irradiate the irradiation target, which includes the sample S fixed to the sample stage 12, the sample piece Q, the needle 18 present in the irradiation area, and others, with an electron beam from above downward in a tilt direction with the tilt of a predetermined angle (for example, 60°) with respect to the vertical direction.

The electron beam irradiation optical system 15 includes an electron source 15a configured to generate electrons, and an electron optical system 15b configured to focus and deflect the electrons emitted from the electron source 15a. The electron source 15a and the electron optical system 15b are controlled in accordance with a control signal output from the control computer 22 such that an irradiation position, irradiation conditions, and the like of the electron beam are controlled by the control computer 22.

The arrangement of the electron beam irradiation optical system 15 and the focused ion beam irradiation optical system 14 may be switched so as to arrange the electron beam irradiation optical system 15 in the vertical direction, and arrange the focused ion beam irradiation optical system 14 in the tilt direction with the tilt of a predetermined angle in the vertical direction.

The detector 16 detects secondary charged particles (secondary electrons or secondary ions) R generated from the irradiation target by irradiation with a focused ion beam or an electron beam. The gas supply unit 17 supplies gas G to a surface of the irradiation target. The needle 18 takes the sample piece Q, which is minute, out of the sample S fixed to the sample stage 12, and holds and transports the sample piece Q to the sample piece holder P. The needle driving mechanism 19 drives the needle 18 to convey the sample piece Q. In the following description, the needle 18 and the needle driving mechanism 19 may collectively be referred to as "sample piece transportation unit".

The absorption current detector 20 detects an inflowing current (also called an absorption current) of a charged particle beam that flows into the needle 18, and outputs the result of the detection as an inflowing current signal to the control computer 22.

The control computer 22 controls at least the stage driving mechanism 13, the focused ion beam irradiation optical system 14, the electron beam irradiation optical system 15, the gas supply unit 17, and the needle driving mechanism 19. The control computer 22 is arranged outside the sample chamber 11, and is connected to the display device 21, and the input device 23, for example, a mouse or a keyboard, which is configured to output a signal corresponding to an input operation of an operator. The control computer 22 centrally controls the operation of the charged particle beam apparatus 10 with the signal output from the input device 23, or a signal generated by preset automatic driving control processing, for example.

As described above, the control computer 22 performs position control with respect to a target, based on the result of the determination by the image processing computer 30. The control computer 22 includes a communication interface for communication to and from the image processing computer 30.

The control computer 22 uses the inflowing current signal output from the absorption current detector 20 as absorption current image data to create an image from the signal. Here, the control computer 22 converts the detected amount of the secondary charged particles R, which are detected by the detector 16 during scanning of an irradiation position irradiated with the charged particle beam, into a luminance signal associated with the irradiation position, and generates absorption current image data indicating a shape of the irradiation target by means of a two-dimensional position distribution of the detected amount of the secondary charged particles R. In an absorption current image mode, the control computer 22 generates absorption current image data, which indicates the shape of the needle 18 by means of a two-dimensional position distribution of an absorption current (absorption current image), by detecting an absorption current that flows in the needle 18 during the scanning of the irradiation position irradiated with the charged particle beam. The control computer 22 displays the generated image data on the display device 21.

The display device 21 displays, among others, image data based on the secondary charged particles R, which are detected by the detector 16.

The charged particle beam apparatus 10 can execute visualization of an irradiation target, various types of processing (digging, trimming processing, and the like) through sputtering, the forming of a deposition film, and others by irradiating and scanning a surface of the irradiation target with a focused ion beam.

Figure 3:
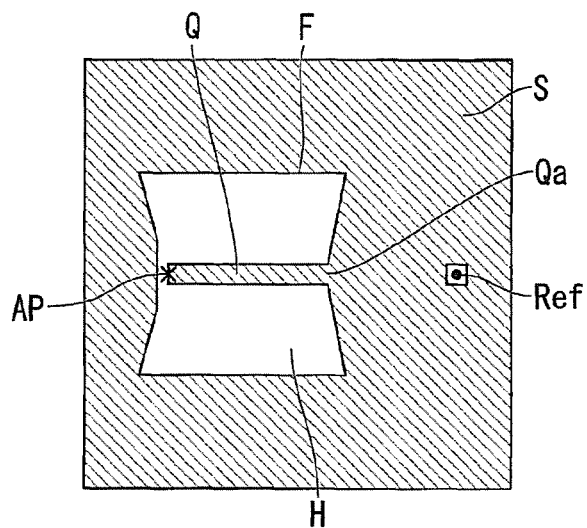
FIG. 3 is a plan view for illustrating a sample piece in the first embodiment of the present invention.

FIG. 3 is a plan view for illustrating the sample piece Q formed by irradiating a surface (hatched part) of the sample S with a focused ion beam in the charged particle beam apparatus 10 according to the first embodiment of the present invention, prior to the extraction of the sample piece Q from the sample S. A reference symbol "F" indicates a frame of processing with a focused ion beam, namely, a scanning range of the focused ion beam. The inside (white part) of the frame is a processed area H created by digging through sputtering processing that is executed by irradiation with the focused ion beam. A reference mark "Ref" represents a reference point indicating a position at which the sample piece Q is to be formed (the position of a part to be left intact in the digging). A rough position of the sample piece Q is found out with the use of the deposition film, and fine positioning of the sample piece Q uses a minute hole. In the sample S, peripheral parts of the sample piece Q are ground and removed on the sides and at the bottom by etching processing, with a support portion Qa, which is connected to the sample S, left intact. The sample piece Q is cantilevered to the sample S by the support portion Qa.

The sample piece holder P is described next with reference to FIG. 4 and FIG. 5.

Figure 4:
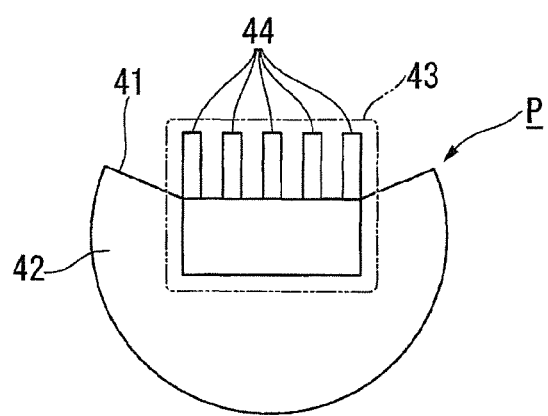
FIG. 4 is a plan view of a sample piece holder in the first embodiment of the present invention.
Figure 5:
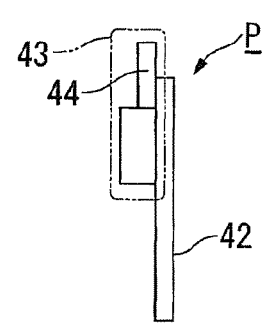
FIG. 5 is a side view of the sample piece holder in the first embodiment of the present invention.

FIG. 4 is a plan view of the sample piece holder P and FIG. 5 is a side view of the sample piece holder P. The sample piece holder P includes a base portion 42, which is a substantially semicircular plate and which has a cutout portion 41, and a sample table 43 fixed to the cutout portion 41. The base portion 42 is formed of, for example, metal having a circular plate shape. The sample table 43 includes a plurality of protruding pillar-like portions (hereinafter also referred to as "pillars") 44, which are spaced apart from one another to have a comb-teeth shape and to which sample pieces Q are to be transported.

(Image Processing Computer)

Figure 6:
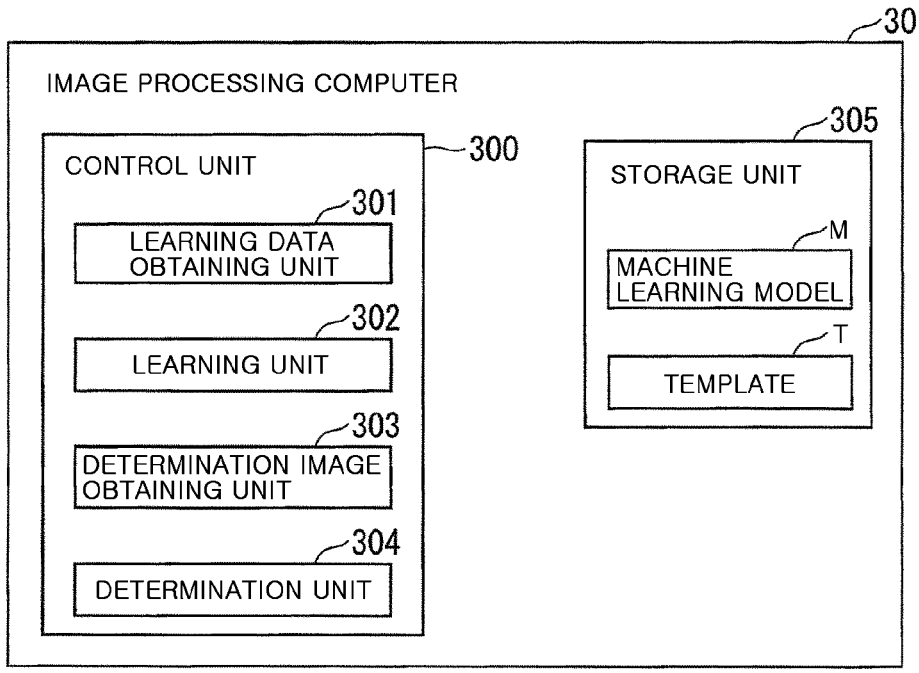
FIG. 6 is a diagram for illustrating an example of the configuration of the image processing computer in the first embodiment of the present invention.

The image processing computer 30 is described next with reference to FIG. 6. FIG. 6 is a diagram for illustrating an example of a configuration of the image processing computer 30 in the first embodiment. The image processing computer 30 includes a control unit 300 and a storage unit 305.

The control unit 300 includes a learning data obtaining unit 301, a learning unit 302, a determination image obtaining unit 303, and a determination unit 304.

The learning data obtaining unit 301 obtains learning data. The learning data is information used for learning in machine learning. The learning data is a combination of a learning image and information indicating the position of a target in the learning image. Examples of the target in the learning image include the sample piece, the needle, and the pillar-like portions included in the sample piece holder. The type of the target in the learning image and the type of a target in a determination image are the same. For instance, when the type of the target in the learning image is sample piece, needle, or pillar-like portion, the type of the target in the determination image is sample piece, needle, or pillar-like portion, respectively.

In the first embodiment, an SIM image and an SEM image obtained in advance by the irradiation of the target with a charged particle beam are used as the learning image. The charged particle beam is radiated onto the target from a predetermined direction. In the charged particle beam apparatus 10, the direction of a lens barrel of each charged particle beam irradiation optical system is fixed, and the direction in which the charged particle beam is radiated onto the target is accordingly predetermined.

An example of the information indicating the position of the target in the learning image is coordinates indicating the position of the target in the learning image. The coordinates indicating the position in the learning image are, for example, two-dimensional orthogonal coordinates or polar coordinates.

The learning image includes both of an SIM image of the target and an SEM image of the target. The learning image is both of an SIM image in which the target is viewed from the tilt direction with the tilt of a predetermined angle with respect to the vertical direction of the sample stage 12 and an SEM image in which the target is viewed from the vertical direction of the sample stage 12. That is, the learning image includes an image of the target viewed from a first direction defined with the sample stage 12 as a reference, and an image of the target viewed from a second direction. The second direction is a direction that is defined with the sample stage 12 as a reference and that is not the first direction.

The learning unit 302 executes machine learning based on the learning data, which is obtained by the learning data obtaining unit 301. The learning unit 302 stores the result of the learning as the machine learning model M in the storage unit 305. The learning unit 302, for example, executes machine learning for each target type of the learning image included in the learning data. The machine learning model M is accordingly generated for each target type of the learning image included in the learning data. The learning unit 302 may not execute machine learning for each target type. That is, common machine learning may be executed regardless of the type of the target. Whether the learning unit 302 executes machine learning for each target type is set on the image processing computer 30 based on, for example, settings input to the control computer 22.

The machine learning model M includes a plurality of models. The plurality of models included in the machine learning model M are discriminated from one another not only by sets of learning data used in the generation of the models but also by algorithms of machine learning.

In the following description, a target captured by image pickup or drawn in an image may be referred to as "target of the image".

The machine learning executed by the learning unit 302 is deep learning using, for example, a convolutional neural network (CNN). The machine learning model M in this case includes a multi-layer neural network in which weighting between nodes is varied depending on association between a learning image and the position of a target in the learning image. The multi-layer neural network includes an input layer in which nodes correspond to pixels of an image and an output layer in which nodes correspond to positions in the image. When the luminance value of each pixel in an SIM image or an SEM image is input to the input layer, a set of values indicating a position in the image is output from the output layer.

The determination image obtaining unit 303 obtains a determination image. The determination image is an SIM image and SEM image output from the control computer 22. The determination image includes the images of the target described above. The target of the determination image includes objects related to irradiation with a charged particle beam, for example, the sample piece Q and the needle 18 after use.

The determination image is both of an SIM image in which the target is viewed from the tilt direction with the tilt of a predetermined angle with respect to the vertical direction of the sample stage 12 and an SEM image in which the target is viewed from the vertical direction of the sample stage 12. That is, the determination image includes an image of the target viewed from the first direction and an image of the target viewed from the second direction. The first direction is a direction defined with the sample stage 12 as a reference, and the second direction is a direction that is defined with the sample stage 12 as a reference and that is not the first direction.

The determination unit 304 determines the position of the target that is included in the determination image obtained by the determination image obtaining unit 303, based on template matching. The determination unit 304 uses the template T about the target in the template matching. The template T is created in advance from an image of the target that is obtained by irradiation with a charged particle beam. The template T is stored in, for example, the storage unit 305.

When template matching fails, the determination unit 304 determines the position of the target that is included in the determination image obtained by the determination image obtaining unit 303, based on the machine learning model M, which is generated through the execution of learning by the learning unit 302.

Examples of the position of the target included in the determination image include a pick-up position of the sample piece in each of the SIM image and the SEM image, the position of the tip of the needle in each of the SIM image and the SEM image, and the position of the pillar-like portion 44 in each of the SIM image and the SEM image. The determination unit 304 determines, for example, the coordinates of the target in the determination image as the position of the target included in the determination image.

In the first embodiment, when the target is the sample piece Q, for example, the determination unit 304 determines the pick-up position of the sample piece Q based on template matching and, in the event of a failure at template matching, determines the pick-up position based on the machine learning model M. When the target is the pillar-like portions 44 or the needle 18, on the other hand, the determination unit 304 determines the positions of the pillar-like portions 44 or the position of the tip of the needle 18 based on the machine learning model M. For the target that is the pillar-like portions 44, the needle 18, or another target that is not the sample piece Q, the determination unit 304 may determine the position of the target based on template matching and, in the event of a failure at the determination, execute this determination based on the machine learning model M as is the case for the sample piece Q.

Which algorithm is to be used for the determination of the position of the target is set in advance by, for example, the user.

The determination based on template matching is an example of the first determination, and the determination based on the machine learning model M is an example of the second determination.

The image processing computer 30 may obtain the template T or a learned machine learning model from, for example, an external database. In that case, the control unit 300 may not include the learning data obtaining unit 301 and the learning unit 302.

In the following description, the operation of automated micro-sampling (MS) executed by the control computer 22, namely, the operation of automatically transporting the sample piece Q, which has been formed by processing the sample S with a charged particle beam (focused ion beam), to the sample piece holder P, is broken roughly into an initial setting step, a sample piece pick-up step, and a sample piece mounting step, and the steps are described in order.

(Initial Setting Step)

Figure 7:
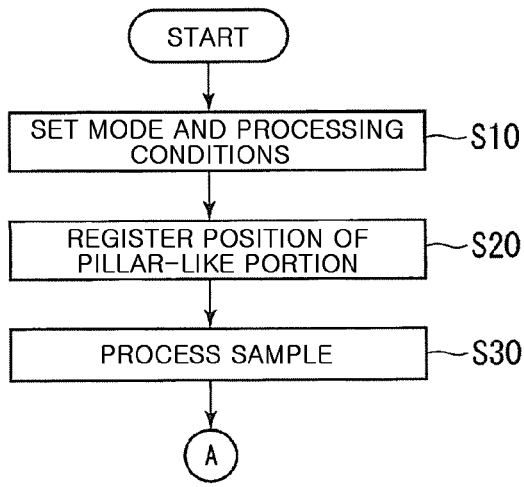
FIG. 7 is a diagram for illustrating an example of an initial setting step in the first embodiment of the present invention.

FIG. 7 is a diagram for illustrating an example of the initial setting step in the first embodiment.

Step S10: The control computer 22 executes the setting of a mode and processing conditions. The setting of a mode involves setting whether to set a posture control mode, which is described later, based on an operator's input at the start of an automation sequence. The setting of processing conditions involves setting the processing position, dimensions, the number of sample pieces Q, and the like.

Step S20: The control computer 22 registers the position of the pillar-like portion 44. The control computer 22 at this point transmits an SIM image and an SEM image that include the pillar-like portion 44 as the target to the image processing computer 30.

In the first embodiment, the absorption current image data including a target is a combination of an SIM image of the target and an SEM image of the target. That is, the SIM image and the SEM image that include the target are a combination of an SIM image in which the target is viewed from the tilt direction with the tilt of a predetermined angle with respect to the vertical direction of the sample stage 12 and an SEM image in which the target is viewed from the vertical direction of the sample stage 12.

The determination image obtaining unit 303 obtains the SIM image and the SEM image as the determination image from the image processing computer 30. The determination unit 304 determines, based on the machine learning model M, the position of the pillar-like portion 44 that is included in the determination image obtained by the determination image obtaining unit 303. The determination unit 304 outputs position information indicating the determined position of the pillar-like portion 44 to the control computer 22.

The determination unit 304 determines the two-dimensional coordinates of the position of the target on the sample stage 12 from the SIM image in which the target is viewed from the tilt direction with the tilt of a predetermined angle with respect to the vertical direction of the sample stage 12. The determination unit 304 uses an SEM image in which the target is viewed from the tilt direction with the tilt of a predetermined angle with respect to the vertical direction of the sample stage 12 as well to determine two-dimensional coordinates of the position of the target on a plane perpendicular to the tilt direction. The determination unit 304 determines the position of the target in the form of values of three-dimensional coordinates, based on the determined two-dimensional coordinates on the sample stage 12 and the determined two-dimensional coordinates on the plane perpendicular to the tilt direction.

The determination unit 304 calculates the values of the three-dimensional coordinates with the use of direction information, which is information about directions in which the electron beam irradiation optical system 15 and the focused ion beam irradiation optical system 14 are arranged in the charged particle beam apparatus 10, and about an angle between the two optical systems. The determination unit 304 reads the direction information stored in advance in the storage unit 305, or obtains the direction information from the control computer 22.

In Step S20, the target is the pillar-like portion 44. The determination unit 304 executes the same processing as the one in this step to determine the position of a target in the following steps except for the case in which the target is the sample piece Q.

The pillar-like portions 44 and learning images of the pillar-like portions 44 to be used in the generation of the machine learning model M are described with reference to FIG. 8 to FIG. 12.

Figure 8:
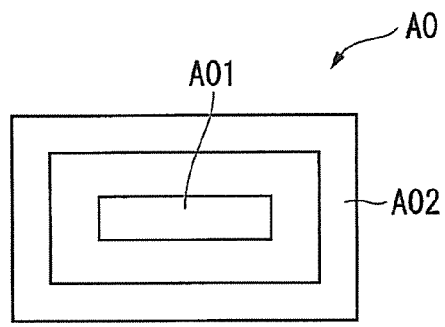
FIG. 8 is a top view of a pillar-like portion in the first embodiment of the present invention.
Figure 9:
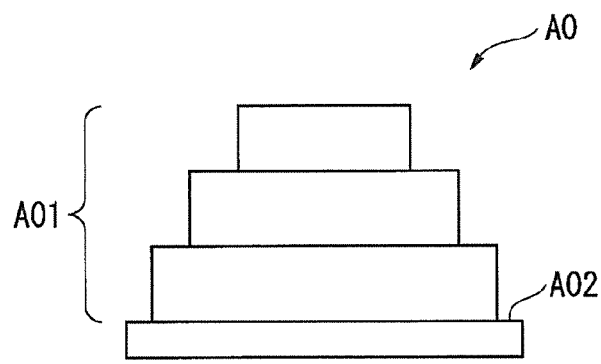
FIG. 9 is a side view of the pillar-like portion in the first embodiment of the present invention.

FIG. 8 and FIG. 9 are views for illustrating an example of the pillar-like portions 44 in the first embodiment. A pillar-like portion A0 illustrated in FIG. 8 and FIG. 9 is an example of the design structure of the pillar-like portions 44. FIG. 8 is a top view of the pillar-like portion A0, and FIG. 9 is a side view of the pillar-like portion A0. The pillar-like portion A0 has a structure in which a pillar A01 having a tiered structure is adhered to a base portion A02.

Figure 10:
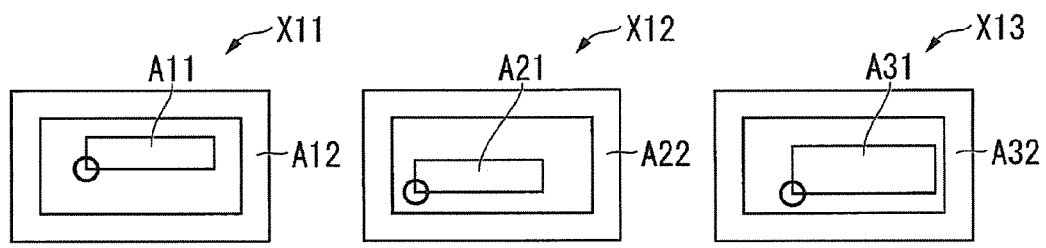
FIG. 10 is a diagram for illustrating an example of learning images of the pillar-like portions in the first embodiment of the present invention.

FIG. 10 is a diagram for illustrating an example of learning images of the pillar-like portions 44 in the first embodiment. A learning image X11, a learning image X12, and a learning image X13 are used for the learning of the positions of the pillar-like portions 44. In the learning image X11, the learning image X12, and the learning image X13, information indicating the position of a pillar-like portion is illustrated as a circle.

A pillar A11 in the learning image X11, a pillar A21 in the learning image X12, and a pillar A31 in the learning image X13 differ in shape from one another. A base portion A12 in the learning image X11, a base portion A22 in the learning image X12, and a base portion A32 in the learning image X13, on the other hand, have the same shape.

The learning image X11, the learning image X12, and the learning image X13 are learning images for determining, as an example, the positions of the pillar-like portions 44 that are included in the SIM image and the SEM image when the pillar-like portions 44 are viewed from a horizontal direction of the sample stage 12. Although the focused ion beam irradiation optical system 14 and the electron beam irradiation optical system 15 in FIG. 2 do not face the sample stage 12 from the horizontal direction of the sample stage 12, one of the focused ion beam irradiation optical system 14 and the electron beam irradiation optical system 15 may face the sample stage 12 from the horizontal direction, and the learning image X11, the learning image X12, and the learning image X13 are learning images for determining the positions of the pillar-like portions 44 in that case.

Figure 11:
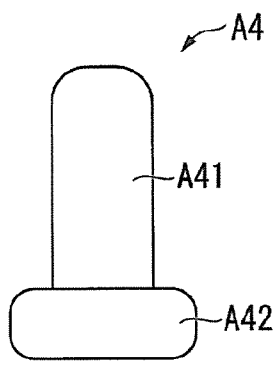
FIG. 11 is a view for illustrating an example of the pillar-like portion in the first embodiment of the present invention, in which a pillar does not have a tiered structure.

FIG. 11 is a view for illustrating an example of the pillar-like portions 44 in the first embodiment, in which a pillar does not have a tiered structure. A pillar-like portion A4 illustrated in FIG. 11 is an example of the design structure of the pillar-like portions 44 that does not give a pillar a tiered structure, and is viewed from the side.

Figure 12:
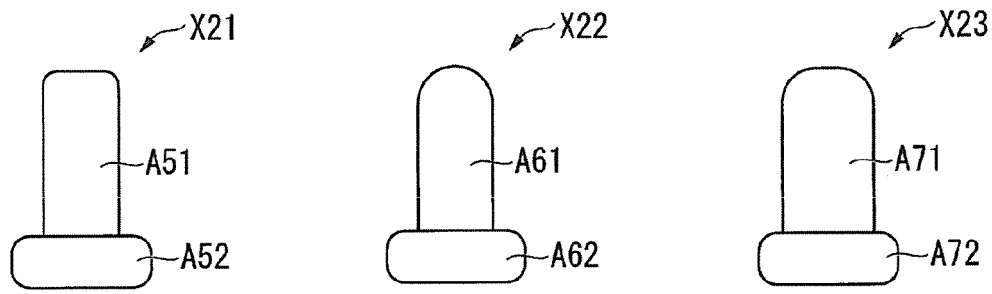
FIG. 12 is a diagram for illustrating an example of learning images of the pillar-like portions in the first embodiment of the present invention, in which the pillar does not have a tiered structure.

FIG. 12 is a diagram for illustrating an example of learning images of the pillar-like portions 44 in the first embodiment, in which a pillar does not have a tiered structure. A learning image X21, a learning image X22, and a learning image X23 are learning images for determining, as an example, the positions of the pillar-like portions 44 that are included in the SEM image when the pillar-like portions 44 are viewed from the vertical direction of the sample stage 12.

A pillar A51 in the learning image X21, a pillar A61 in the learning image X22, and a pillar A71 in the learning image X23 differ in shape from one another. A base portion A52 in the learning image X21, a base portion A62 in the learning image X22, and a base portion A72 in the learning image X23, on the other hand, have the same shape.

In the template matching of the related art, a difference in pillar shape results in unsuccessful determination of the position of a pillar-like portion in some cases. In the machine learning model M, on the other hand, base portion shapes, for example, are learned as a feature amount because the machine learning model M is generated based on machine learning that uses learning images including the base portions of the pillar-like portions 44. The charged particle beam apparatus 10 is therefore improved in the precision of the determination of the pillar-like portions even when there is a difference in pillar shape.

A target object of a learning image is preferred to be designed so that target objects of a plurality of learning images include parts that are the same in shape in one target object and another target object.

Referring back to FIG. 7, the description of the initial setting step is continued.

The control computer 22 registers the position of the pillar-like portion 44 based on the position information indicating the position of the pillar-like portion 44 that has been determined by the image processing computer 30.

Learning images of the pillar-like portions 44 are preferred to include images of two of the pillar-like portions 44 that are located at both ends of the sample table 43. The image processing computer 30 detects the two of the pillar-like portions 44 that are at both the ends of the sample table 43 separately from the other pillar-like portions 44, based on the machine learning model M that is generated with the use of the learning data that includes those learning images. The control computer 22 may calculate a tilt of the sample piece holder P from the positions of the detected pillar-like portions at the ends. The control computer 22 may correct the coordinate values of the position of the target based on the calculated tilt.

Step S30: The control computer 22 controls the focused ion beam irradiation optical system 14 to process the sample S.

(Sample Piece Pick-up Step)

Figure 13:
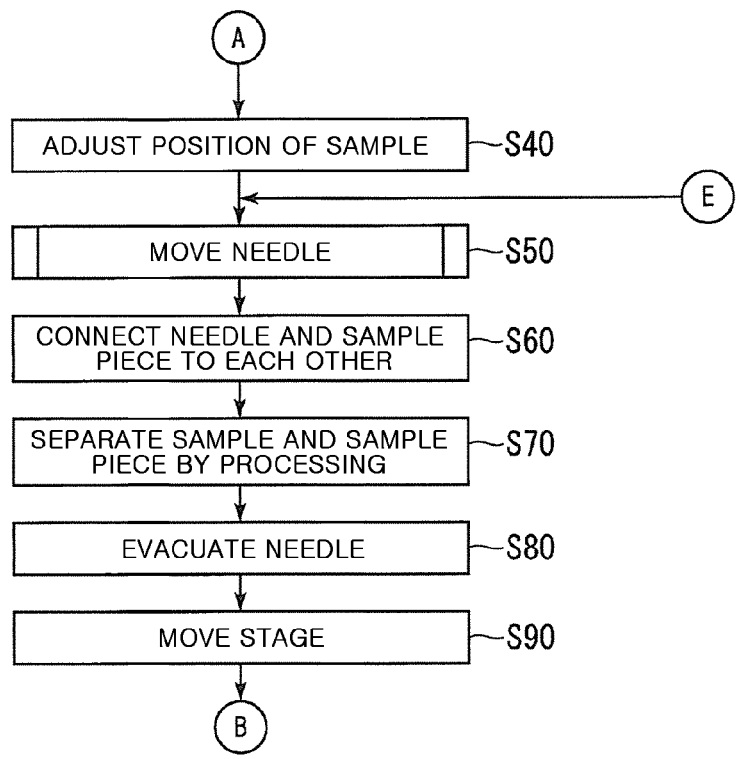
FIG. 13 is a diagram for illustrating an example of a sample piece pick-up step in the first embodiment of the present invention.

FIG. 13 is a diagram for illustrating an example of the sample piece pick-up step in the first embodiment. The term "pick-up" used herein refers to the separation and extraction of the sample piece Q from the sample S by processing with a focused ion beam, and by the needle.

Step S40: The control computer 22 adjusts the position of the sample. The control computer 22 uses the stage driving mechanism 13 to move the sample stage 12 so that the sample piece Q that is a target enters a viewing field covered by a charged particle beam. For the moving, the control computer 22 uses a relative position relationship between the reference mark Ref and the sample piece Q. The control computer 22 executes the positioning of the sample piece Q after the sample stage 12 is moved.

Step S50: The control computer 22 executes the moving of the needle 18.

Figure 14:
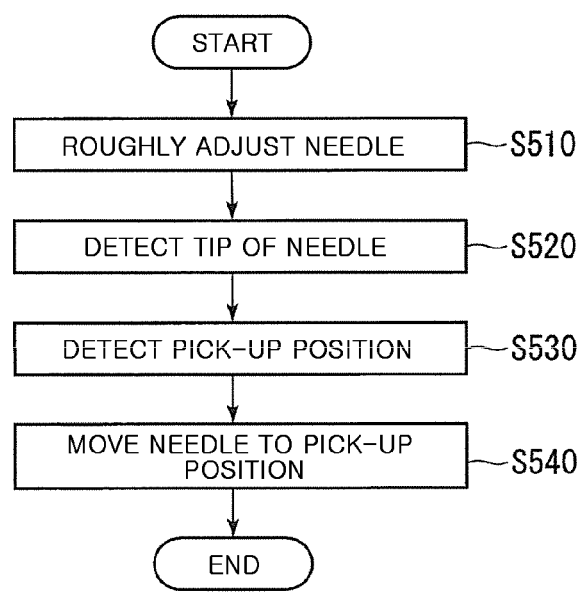
FIG. 14 is a diagram for illustrating an example of processing of moving a needle in the first embodiment of the present invention.

Processing for the moving of the needle 18 executed by the control computer 22 is described with reference to FIG. 14. FIG. 14 is a diagram for illustrating an example of processing of moving the needle 18 in the first embodiment. Step S510 to Step S540 of FIG. 14 correspond to Step S50 of FIG. 13.

Step S510: The control computer 22 executes needle moving (rough adjustment) in which the needle 18 is moved by the needle driving mechanism 19.

Step S520: The control computer 22 detects the tip of the needle 18. The control computer 22 transmits the absorption current image data that includes the needle 18 as a target to the image processing computer 30.

The determination image obtaining unit 303 obtains an SIM image and an SEM image from the image processing computer 30 as a determination image. The determination unit 304 determines, as the position of the target, the position of the needle 18 that is included in the determination image obtained by the determination image obtaining unit 303, based on the machine learning model M. The determination unit 304 outputs the position information that indicates the determined position of the needle 18 to the control computer 22.

The control computer 22 next executes needle moving (fine adjustment) in which the needle 18 is moved by the needle driving mechanism 19, based on the position information that indicates the position of the needle 18 determined by the image processing computer 30.

The needle 18 and learning images of the needle 18 to be used in the generation of the machine learning model M are described with reference to FIG. 16 to FIG. 19.

Figure 16:
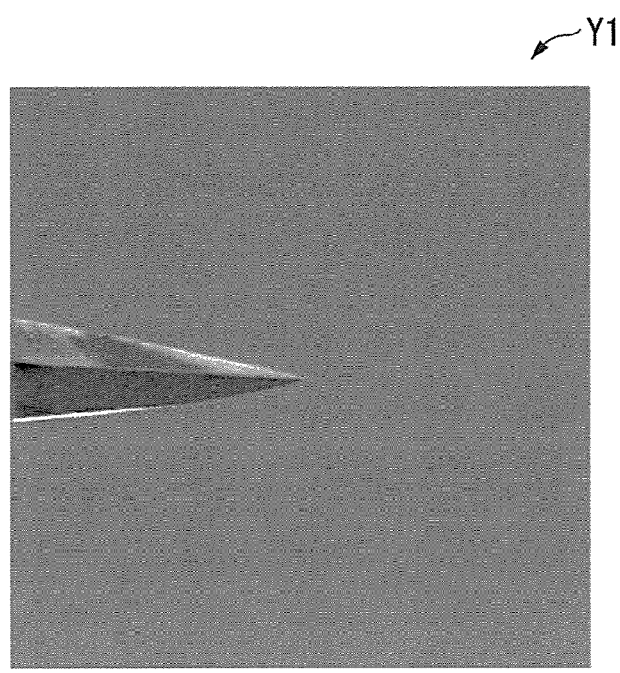
FIG. 16 is a diagram for illustrating an example of SEM image data that includes a tip of the needle in the first embodiment of the present invention.
Figure 17:
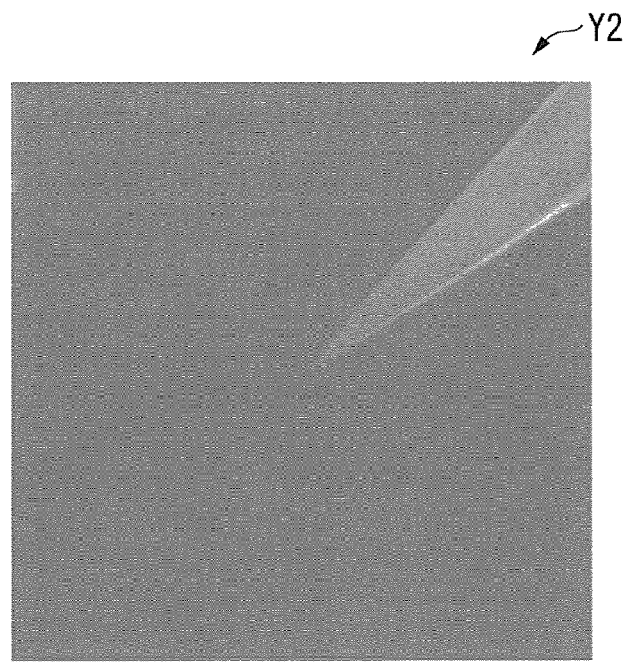
FIG. 17 is a diagram for illustrating an example of SIM image data that includes the tip of the needle in the first embodiment of the present invention.

FIG. 16 is a diagram for illustrating an example of SEM image data that includes the tip of the needle 18 in the first embodiment. FIG. 17 is a diagram for illustrating an example of SIM image data that includes the tip of the needle 18 in the first embodiment.

Figure 18:
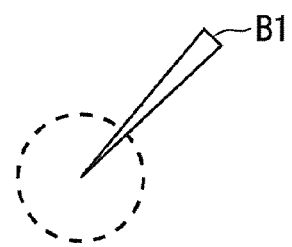
FIG. 18 is a diagram for illustrating an example of the tip of the needle in the first embodiment of the present invention.

FIG. 18 is a diagram for illustrating an example of the tip of the needle 18 in the first embodiment. In FIG. 18, a needle B1 viewed from a tilt direction with the tilt of a predetermined angle with respect to the vertical direction of the sample stage 12 is illustrated as an example of the needle 18.

Figure 19:
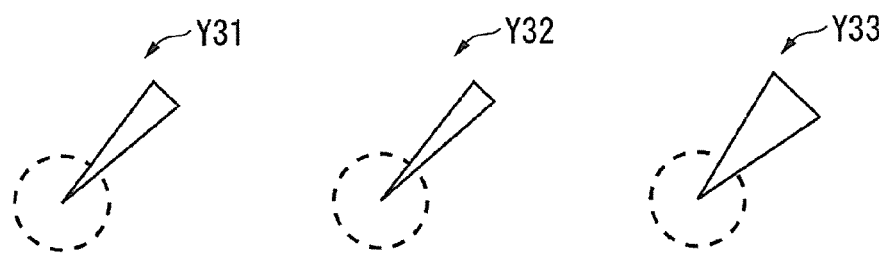
FIG. 19 is a diagram for illustrating an example of learning images of the needle in the first embodiment of the present invention.

FIG. 19 is a diagram for illustrating an example of learning images of the needle 18 in the first embodiment. A learning image Y31, a learning image Y32, and a learning image Y33 are used for the learning of the position of the tip of the needle 18. In the learning image Y31, the learning image Y32, and the learning image Y33, information indicating the position of the tip of the needle 18 is illustrated as a circle. The thickness of the tip of the needle varies in the learning image Y31, the learning image Y32, and the learning image Y33. The shape of the tip of the needle, on the other hand, is the same in the learning image Y31, the learning image Y32, and the learning image Y33.

The actual thickness of the tip of the needle 18 is changed by cleaning. In the template matching of the related art, a difference in the thickness of the tip of the needle results in unsuccessful determination of the position of the tip of the needle in some cases. In the machine learning model M, on the other hand, needle tip shapes, for example, are learned as a feature amount because the machine learning model M is generated based on machine learning that uses learning images including the tip of the needle 18. The charged particle beam apparatus 10 is therefore improved in the precision of the determination of the tip of the needle even when there is a difference in needle tip thickness.

Figure 15:
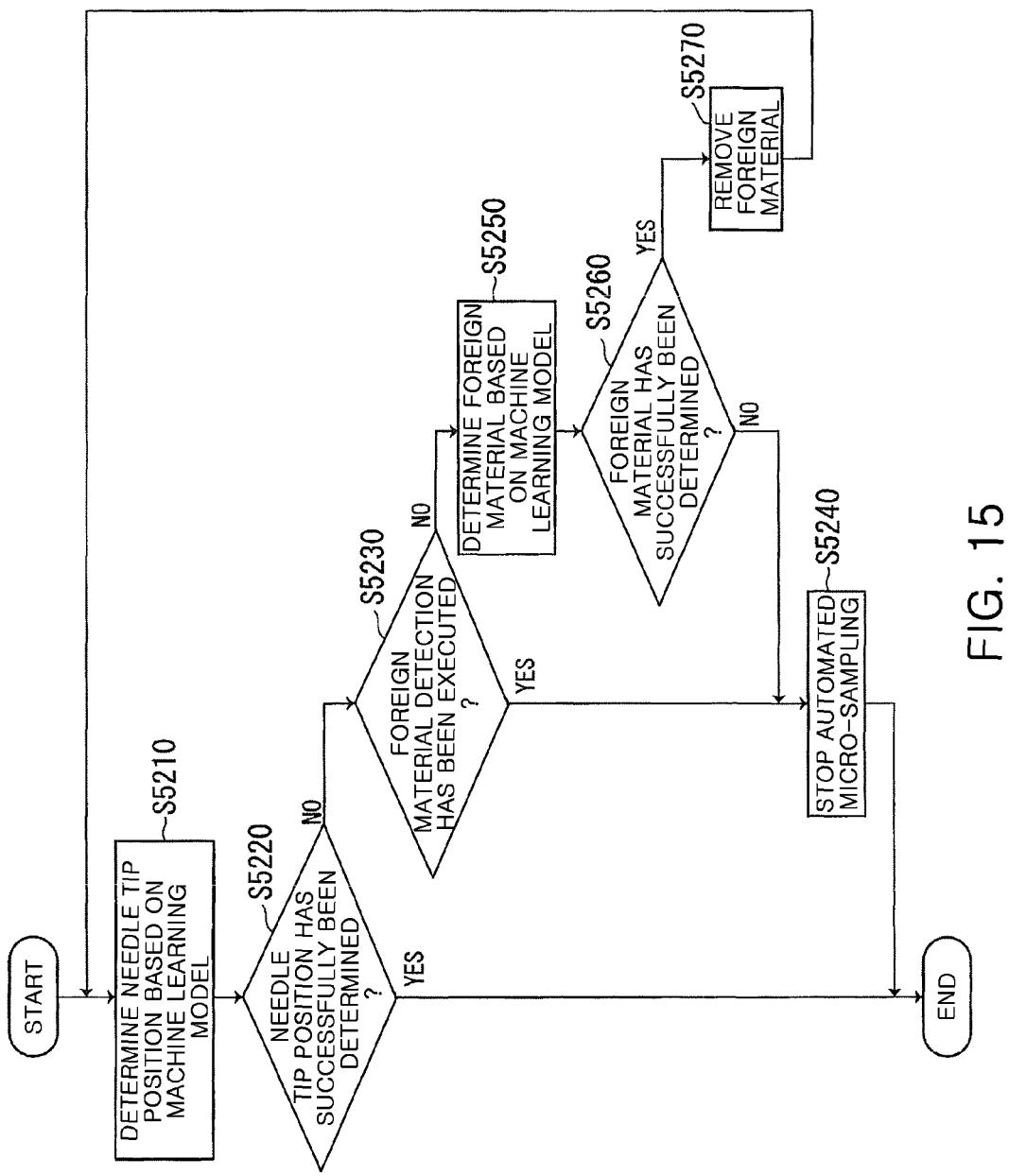
FIG. 15 is a diagram for illustrating an example of needle tip position determination processing in the first embodiment of the present invention.

Details of processing in which the image processing computer 30 determines the position of the tip of the needle 18 are described with reference to FIG. 15. FIG. 15 is a diagram for illustrating an example of needle tip position determination processing in the first embodiment. The needle tip position determination processing illustrated in FIG. 15 is executed in Step S520 of FIG. 14.

Step S5210: The determination unit 304 determines, based on the machine learning model M, as the position of the target, the position of the tip of the needle 18 that is included in the determination image obtained by the determination image obtaining unit 303.

Step S5220: The determination unit 304 determines whether the position of the tip of the needle 18 has successfully been determined. When it is determined that the position of the tip of the needle has successfully been determined (Step S5220: YES), the determination unit 304 outputs the position information that indicates the determined position of the tip of the needle 18 to the control computer 22, and ends the needle tip position determination processing. When it is determined that the position of the tip of the needle 18 has not successfully been determined (Step S5220: NO), on the other hand, the determination unit 304 executes processing of Step S5230.

Figure 20:
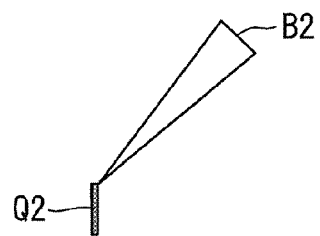
FIG. 20 is a diagram for illustrating an example of a sample piece adhered to the tip of the needle in the first embodiment of the present invention.

The case in which the position of the tip of the needle 18 cannot be determined is, for example, a case in which the position of the tip of the needle 18 is not determined accurately due to a sample piece fragment that is generated by cutting out the sample piece Q and that adheres to the tip of the needle 18. FIG. 20 is a diagram for illustrating an example of a sample piece Q2 adhering to the tip of a needle B2 in the first embodiment.

In the following description, a case in which the position of the tip of the needle 18 cannot be determined may be referred to as "abnormal case".

Step S5230: The determination unit 304 determines whether foreign material detection has been executed in the current pick-up position determination processing. When it is determined that foreign material detection has been executed (Step S5230: YES), the determination unit 304 executes processing of Step S5240. When it is determined that foreign material detection has not been executed (Step S5230: NO), on the other hand, the determination unit 304 executes processing of Step S5250.

Step S5240: The determination unit 340 causes the control computer 22 to stop automated MS. The determination unit 304 outputs a stop signal for stopping automated MS to the control computer 22. The determination unit 304 then ends the needle tip position determination processing.

Step S5250: The determination unit 304 determines, based on the machine learning model M, a foreign material that is included in the determination image obtained by the determination image obtaining unit 303. The term "foreign material" here refers to a part of the sample piece Q that adheres to the tip of the needle 18.

Figure 21:
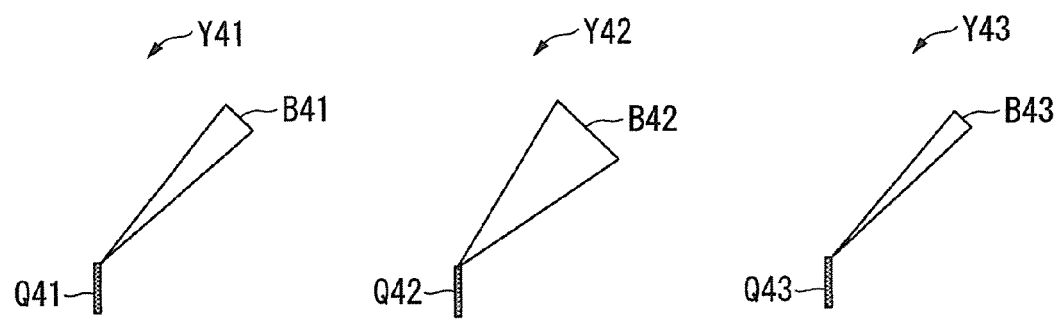
FIG. 21 is a diagram for illustrating an example of learning images for abnormal cases in the first embodiment of the present invention.
Figure 21:
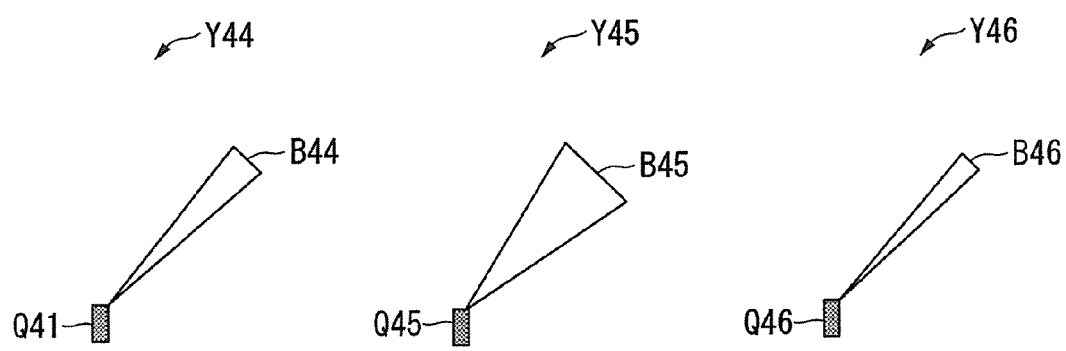

Learning images for determining an abnormal case by machine learning are described with reference to FIG. 21. FIG. 21 is a diagram for illustrating an example of learning images for abnormal cases in the first embodiment. In each of a learning image Y41, a learning image Y42, a learning image Y43, a learning image Y44, a learning image Y45, and a learning image Y46, a partial sample piece (a sample piece Q41, a sample piece Q42, a sample piece Q43, a sample piece Q44, a sample piece Q45, or a sample piece Q46) is adhering to the tip of the needle (a needle B41, a needle B42, a needle B43, a needle B44, a needle B45, or a needle B46).

Step S5260: The determination unit 304 determines whether a foreign material has successfully been determined. When it is determined that a foreign material has successfully been determined (Step S5260: YES), the determination unit 304 executes processing of Step S5270. When it is determined that a foreign material has not successfully been determined (Step S5260: NO), on the other hand, the determination unit 304 executes processing of Step S5240.

Step S5270: The determination unit 304 causes the control computer 22 to remove the foreign material. The determination unit 304 outputs a control signal for causing the execution of the removal of the foreign material to the control computer 22. The determination unit 304 then executes processing of Step S5210 again. That is, the determination unit 304 determines the position of the tip of the needle 18 from which the foreign material has been removed.

Figure 22:
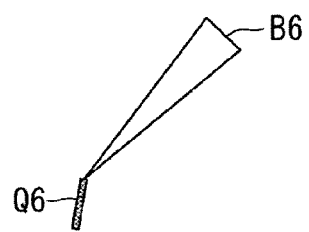
FIG. 22 is a view for illustrating an example of the removal of a foreign material in the first embodiment of the present invention.

The removal of the foreign material is to remove the part of the sample piece Q that adheres to the tip of the needle 18 by cleaning the needle 18. FIG. 22 is a view for illustrating an example of the removal of the foreign material in the first embodiment. In the removal of the foreign material illustrated in FIG. 22, a processing frame FR6 for the cleaning of the needle 18 is set up to remove a foreign material Q6 on a needle B6.

Referring back to FIG. 14, the description of the processing of moving the needle 18 is continued.

Step S530: The control computer 22 detects the pick-up position of the sample piece Q. The control computer 22 transmits an SIM image and an SEM image that include the sample piece Q as a target to the image processing computer 30.

Processing in which the image processing computer 30 determines the pick-up position is described with reference to FIG. 23.

Figure 23:
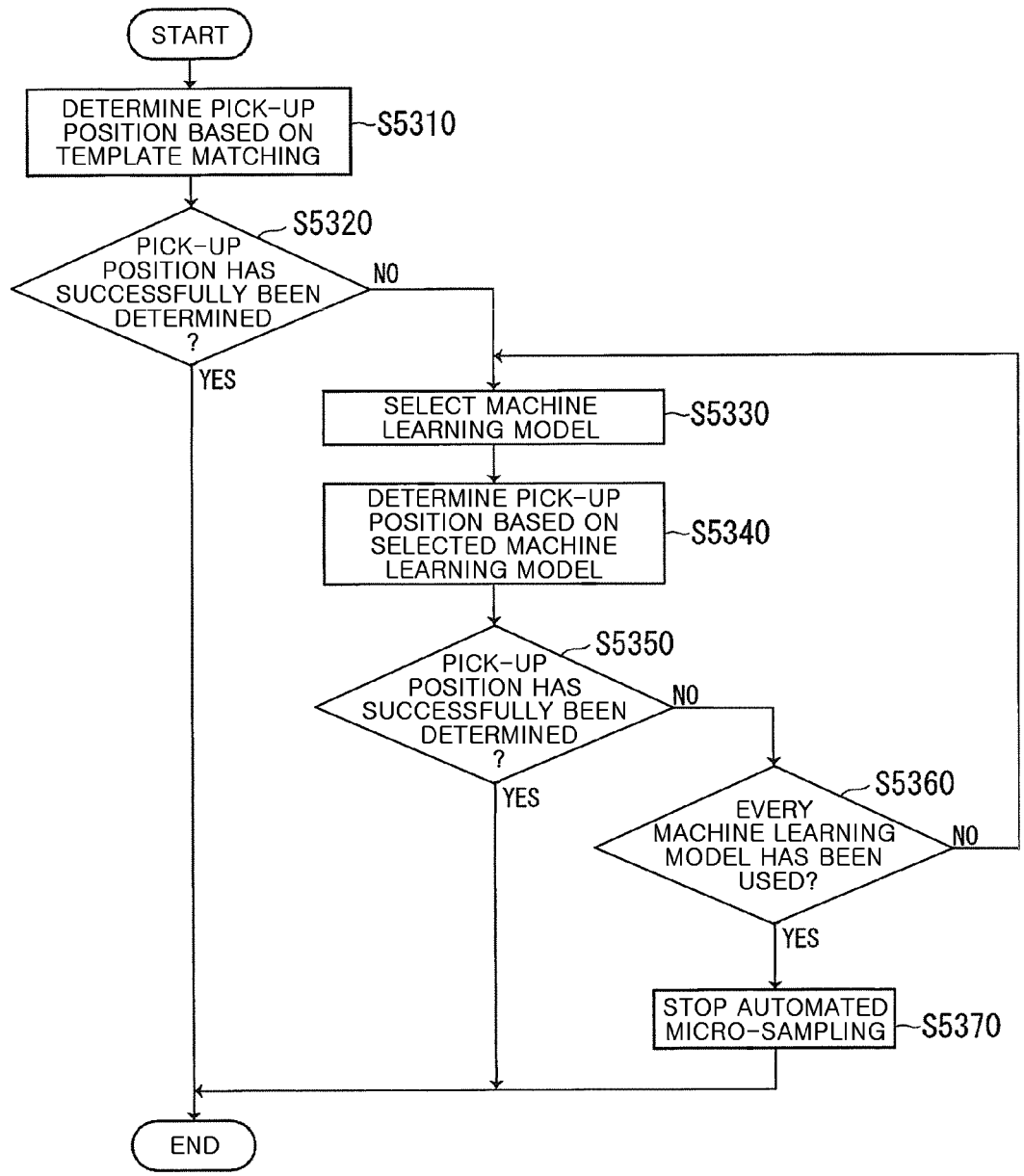
FIG. 23 is a diagram for illustrating an example of pick-up position determination processing in the first embodiment of the present invention.

FIG. 23 is a diagram for illustrating an example of the pick-up position determination processing in the first embodiment. Processing of Step S5310 to processing of Step S5370 illustrated in FIG. 23 correspond to processing of Step S530 of FIG. 14.

Step S5310: The determination unit 304 determines the pick-up position of the sample piece Q that is included in the determination image obtained by the determination image obtaining unit 303, based on template matching. In the template matching, the determination unit 304 uses the template T stored in the storage unit 305.

Step S5320: The determination unit 304 determines whether the pick-up position of the sample piece Q has successfully been determined based on template matching. The determination unit 304 determines that the pickup position has successfully been determined when the score of template matching is equal to or more than a predetermined value.

When it is determined that the pickup position has successfully been determined (Step S5320: YES), the determination unit 304 outputs the position information that indicates the determined pick-up position to the control computer 22, and ends the pick-up position determination processing. When it is determined that the pick-up position has not successfully been determined (Step S5320: NO), the determination unit 304 executes processing of Step S5330.

Step S5330: The determination unit 304 selects a machine learning model M-j to be used for the determination of the pick-up position. The determination unit 304 selects one machine learning model M-j to be used for the determination of the pick-up position out of machine learning models included in the machine learning model M, which are each denoted by M-i (i=1, 2 . . . N: N is the number of the models). In an example given in the first embodiment, the determination unit 304 identifies models that are not selected in the current pick-up position determination processing among the machine learning models included in the machine learning model M, which are each denoted by M-i (i=1, 2 . . . N: N is the number of the models), and selects one model at a time from the identified models in a predetermined order. The predetermined order is, for example, the ascending order of the index number i of the machine learning model M-i.

Step S5340: The determination unit 304 determines the pick-up position based on the selected machine learning model M-j. Processing of this determination is the same as the processing in Step S20 and other steps described above, in which the determination unit 304 determines the position of a target.

Step S5350: The determination unit 304 determines whether the pick-up position of the sample piece Q has successfully been determined based on the selected machine learning model M-j.

When it is determined that the pick-up position has successfully been determined (Step S5350: YES), the determination unit 304 outputs the position information that indicates the determined pick-up position to the control computer 22, and ends the pick-up position determination processing. When it is determined that the pick-up position has not successfully been determined (Step S5350: NO), on the other hand, the determination unit 304 executes processing of Step S5360.

Step S5360: The determination unit 304 determines whether every machine learning model M-i (i=1, 2 . . . N: N is the number of the models) included in the machine learning model M has been used. When it is determined that every machine learning model has been used (Step S5360: YES), the determination unit 304 executes processing of Step S5370. When it is determined that not every machine learning model has been used (Step S5360: NO), on the other hand, the determination unit 304 executes the processing of Step S5330 again.

Step S5370: The determination unit 304 causes the control computer 22 to stop automated MS. The determination unit 304 outputs a stop signal for stopping automated MS to the control computer 22. The determination unit 304 then ends the pick-up position determination processing.

The sample piece Q and learning images of the sample piece Q to be used in the generation of the machine learning model M are described with reference to FIG. 24 and FIG. 25.

Figure 24:
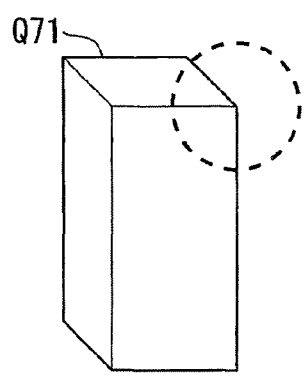
FIG. 24 is a diagram for illustrating an example of SIM image data that includes a sample piece in the first embodiment of the present invention.

FIG. 24 is a diagram for illustrating an example of SIM image data that includes the sample piece Q in the first embodiment. In FIG. 24, a sample piece Q71 is illustrated as an example of the sample piece Q, along with a circle indicating the pick-up position.

Figure 25:
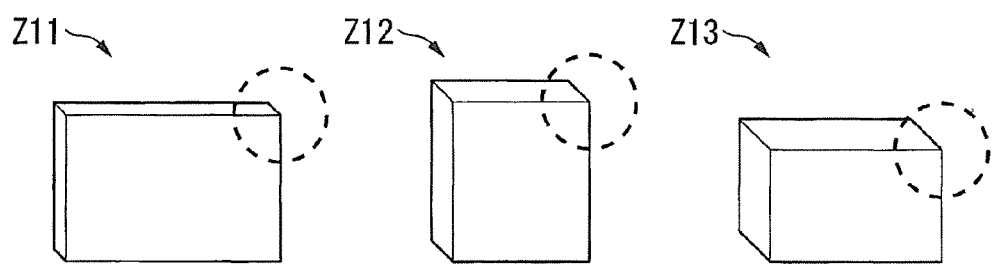
FIG. 25 is a diagram for illustrating an example of learning images of the sample piece in the first embodiment of the present invention.

FIG. 25 is a diagram for illustrating an example of learning images of the sample piece Q in the first embodiment. A learning image Z11, a learning image Z12, and a learning image Z13 are used for the learning of the pick-up position of the sample piece Q. In the learning image Z11, the learning image Z12, and the learning image Z13, information indicating the pick-up position of the sample piece Q is illustrated as a circle. The size and surface shape of the sample piece vary in the learning image Z11, the learning image Z12, and the learning image Z13. The shape of the sample piece at the pick-up position, on the other hand, is the same in the learning image Z11, the learning image Z12, and the learning image Z13.

An actual surface shape of a sample piece varies from one sample piece to another. In the template matching of the related art, a difference in the surface shape of the sample piece results in unsuccessful determination of the pick-up position of the sample piece in some cases. In the machine learning model M, on the other hand, shapes of the sample piece Q at the pick-up position, for example, are learned as a feature amount because the machine learning model M is generated based on machine learning that uses learning images including the pick-up position of the sample piece Q. The charged particle beam apparatus 10 is therefore improved in the precision of the determination of the pick-up position of the sample piece Q even when there is a difference in the surface shape of the sample piece.

In Step S5330 illustrated in FIG. 23, the order in which the machine learning models are selected in the processing of selecting one machine learning model M-j to be used for the determination of the target out of machine learning models included in the machine learning model M, which are each denoted by M-i (i=1, 2 ... N: N is the number of the models), may be changed. For example, when the image processing computer 30 first executes the processing of determining the target (the pick-up position in the example of FIG. 23), the machine learning models may be selected in the above-mentioned predetermined order, and in the processing of the second time and subsequent times, the order may be changed depending on whether the target has successfully been determined in the previous processing.

For example, when the target has successfully been determined based on a machine learning model M-k in the previous processing of determining the target, the determination unit 304 may set a place in the order of the machine learning model M-k as the first place in the order, out of machine learning models included in the machine learning model M, which are each denoted by M-i (i=1, 2 ... N: N is the number of the models). As another example, the determination unit 304 may raise the place in the order of the machine learning model M-k by a predetermined number (for example, one). When the target has not successfully been determined based on the machine learning model M-m in the previous processing of determining the target, on the other hand, the determination unit 304 may set the place in the order of the machine learning model M-m as the last place in the order. As another example, the determination unit 304 may lower the place in the order of the machine learning model M-m by a predetermined number (for example, one).

In the processing of determining the target illustrated in FIG. 23, when the target has not successfully been determined after all of the machine learning models included in the machine learning model M, which are each denoted by M-i (i=1, 2 ... N: N is the number of the models), are used, the learning unit 302 may newly execute machine learning by including the determination image for which the target has not successfully been determined in the learning images, to thereby update the machine learning model M. In this case, for example, the learning unit 302 adds the determination image for which the target has not successfully been determined to the learning data and newly executes machine learning, to thereby update the machine learning model M. A plurality of determination images may be added to the learning data as the images for which the target has not successfully been determined.

Updating the machine learning model M refers to adding a model obtained as a result of newly executing learning to the machine learning model M. As another example, updating the machine learning model M may refer to replacing any one of the plurality of models included in the machine learning model M by the model obtained as a result of newly executing learning.

Timing to update the machine learning model M by the learning unit 302 is, for example, timing of every predetermined number of days. The learning unit 302 updates the machine learning model M, for example, every seven days. The learning unit 302 may update the machine learning model M when the image processing computer 30 receives an operation to update the machine learning model M from the user of the charged particle beam apparatus 10.

After updating the machine learning model M, the learning unit 302 may calculate the precision of the determination based on the updated machine learning model M. In this case, for example, a test image set is stored in advance in the storage unit 305. The test image set is a plurality of images including an image of a target of the same type as the type of the target included in the determination image (the pick-up position in the example of FIG. 23). The test image set may be changed by the user of the charged particle beam apparatus 10 from the test image set stored in advance in the storage unit 305.

For example, the learning unit 302 causes the determination unit 304 to determine, based on the machine learning model M before being updated, the targets included in the images included in the test image set, and calculates the precision of the determination based on results of the determination. The learning unit 302 next causes the determination unit 304 to determine, based on the machine learning model M after being updated, the targets included in the images included in the test image set, and calculates the precision of the determination based on results of the determination. The learning unit 302 calculates, for example, as the precision of the determination, a ratio of images for which the target has successfully been determined to the images included in the test image set. When the precision of the determination of the machine learning model M after being updated has improved to be higher than that of the machine learning model M before being updated, the learning unit 302 replaces the machine learning model M stored in the storage unit 305 by the updated machine learning model M. When the precision of the determination of the machine learning model M after being updated has not been improved to be higher than that of the machine learning model M before being updated, on the other hand, the learning unit 302 discards the machine learning model M after being updated.

The machine learning model M may be generated by the user. In this case, for example, the user operates the image processing computer 30 to generate the machine learning model M. The user prepares learning images in advance. The learning data obtaining unit 301 obtains the learning images prepared in advance by the user. The learning images prepared in advance are generated by, for example, picking up an SIM image and an SEM image with the use of the charged particle beam apparatus. It is preferred that the learning images prepared in advance here be generated by changing a parameter relating to the image in a range similar to a range in which the parameter is changed when the charged particle beam apparatus 10 actually generates an SIM image or an SEM image as the determination image. The parameter relating to the image includes, for example, a contrast, a brightness, a magnification, focus, and a beam condition.

When the user prepares the learning images in advance, it is not preferred that a ratio of a specific type of images in a plurality of images included in the learning images be larger than ratios of the other types of images. When the user prepares the learning images in advance, it is preferred that the learning images include a plurality of types of images so that the numbers of the plurality of types of images are equal to one another. The types of images in this case are distinguished from one another by, for example, the above-mentioned parameter relating to the image.

The learning image may include a pseudo image described later.

When the machine learning model M is generated by the user, appropriateness of the learning image to be used in the machine learning is determined by the user. In this case, the user may use Explainable AI (XAI) in the determination of appropriateness of the learning image. In the XAI, the model of the machine learning explains a process of executing determination. The learning unit 302 determines, based on the XAI, in the process of determining the position of the target in an image including the target by the machine learning model M, an area that has been used as a feature point indicating the position of the target in the image. The learning unit 302 uses, as the XAI, for example, layerwise relevance propagation (LRP) or other such methods. The user determines appropriateness of the learning image by visually checking the area that has been used as the feature point, which is determined by the learning unit 302.

Figure 26:
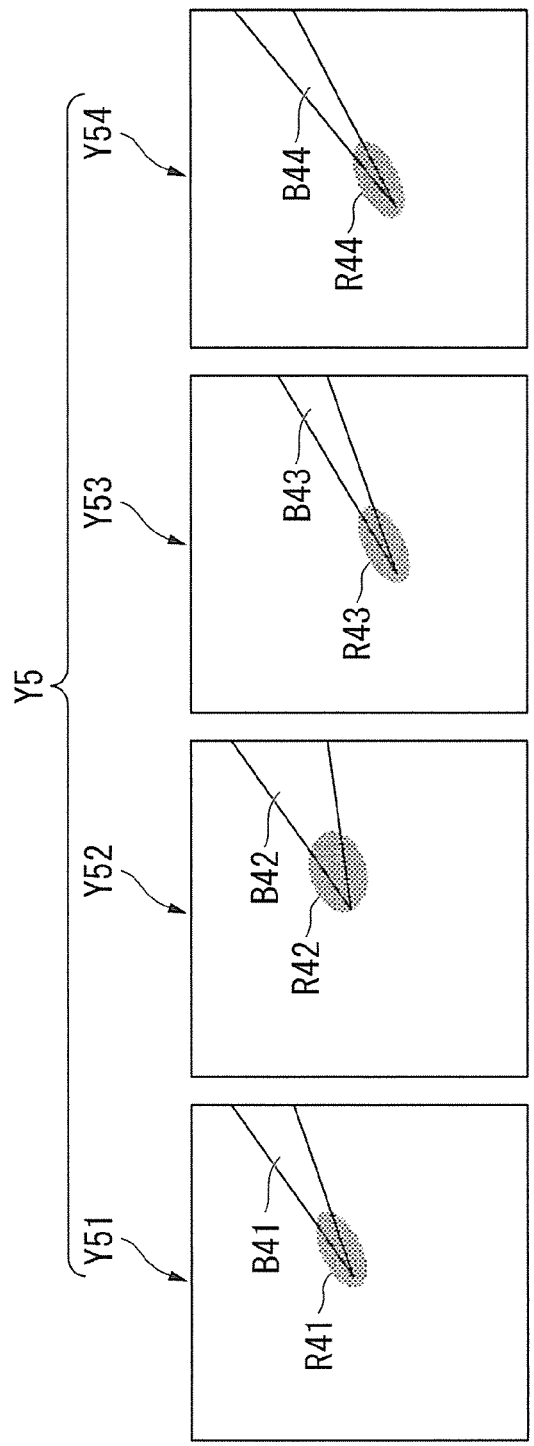
FIG. 26 is a diagram for illustrating an example of learning images in the first embodiment of the present invention.

Referring to FIG. 26 to FIG. 29, the determination of appropriateness of the learning image based on the XAI is now described. FIG. 26 is a diagram for illustrating an example of learning images Y5 in the first embodiment. The learning images Y5 include an image Y51 to an image Y54. The image Y51 to the image Y54 may be any images such as an SEM image, an SIM image, or a pseudo image described later. The image Y51 to the image Y54 include a needle B41 to a needle B44, respectively. In a machine learning model M5 learned based on the learning images Y5, machine learning is executed by imposing a condition that an area R41 to an area R44 are areas indicating the tip of the needle in the image Y51 to the image Y54, respectively. In FIG. 26, the shape of each of the area R41 to the area R44 is an ellipse as an example.

Figure 27:
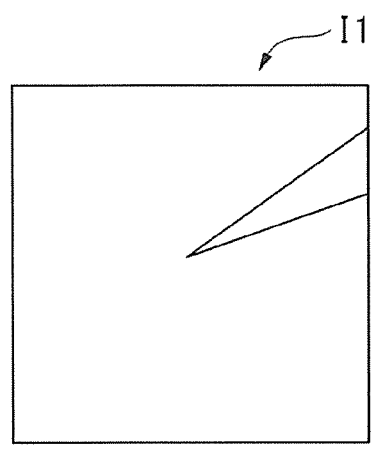
FIG. 27 is a diagram for illustrating an example of an image to be added in the first embodiment of the present invention.

FIG. 27 is a diagram for illustrating an example of an image I1 to be added in the first embodiment. The image I1 to be added is a learning image to be added to the learning images Y5, and is an image for which appropriateness as to whether to add the image to the learning images Y5 is to be determined. The image I1 to be added includes, as an example, an image of a needle. The image I1 to be added may be any images such as an SEM image, an SIM image, or a pseudo image described later.

Figure 28:
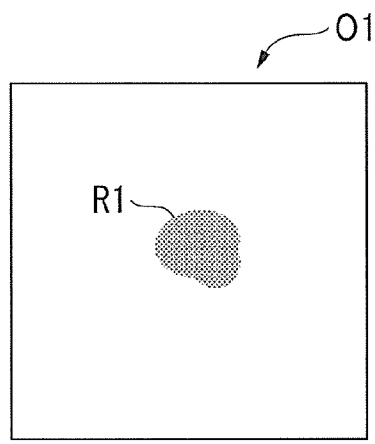
FIG. 28 is a diagram for illustrating an example of an image for which a feature point is determined in the first embodiment of the present invention.
Figure 29:
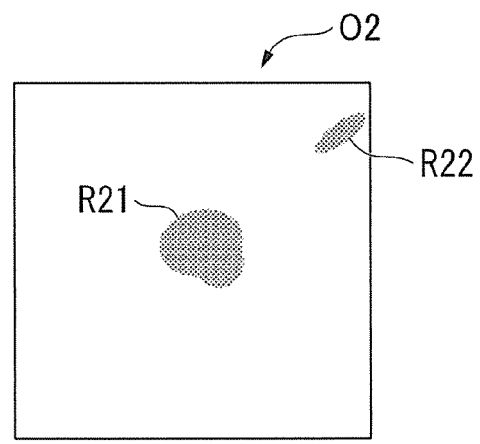
FIG. 29 is a diagram for illustrating an example of an image for which feature points are determined in the first embodiment of the present invention.

FIG. 28 and FIG. 29 are each a diagram for illustrating an example of an image for which a feature point is determined in the first embodiment. In FIG. 28, there is illustrated an image O1 in which, when the position of the tip of the needle included in the image I1 to be added illustrated in FIG. 27 is determined based on, for example, a machine learning model M1 as the machine learning model M, an area R1, which has been used by the machine learning model M1 as the feature point, is shown. In FIG. 29, there is illustrated an image O2 in which, when the position of the tip of the needle included in the image I1 to be added illustrated in FIG. 27 is determined based on, for example, a machine learning model M2 as the machine learning model M, an area R21 and an area R22, which have been used by the machine learning model M2 as the feature points, are shown. The machine learning model M1 and the machine learning model M2 are each generated by executing machine learning based on the learning images Y5.

It is found from the image O1 that the machine learning model M1 executes determination with the use of the area R1 as the feature point. The area R1 corresponds to the position of the tip of the needle. As described above, in the learning images Y5 illustrated in FIG. 26, the area indicating the tip of the needle is shown, and the image I1 to be added is therefore not required to be added to the machine learning model M1. In this case, the user determines that it is not appropriate to add the image I1 to be added to the learning images Y5.

It is found from the image O2 that the machine learning model M2 executes determination with the use of the area R21 and the area R22 as the feature points. The area R21 corresponds to the position of the tip of the needle. Meanwhile, the area R22 corresponds to a position of the needle other than the tip. When the image I1 to be added is used in the learning of the machine learning model M2 by imposing a condition that the area R22 corresponds to the position of the needle other than the tip, it is expected that the position of the needle other than the tip indicated by the area R22 is prevented from being determined as the tip of the needle. In this case, the user determines that it is appropriate to add the image I1 to be added as the learning images Y5.

In the processing of determining the target illustrated in FIG. 23, a description is given of an example of the case in which, when the target has not successfully been determined in Step S5310 based on the template matching, the image processing computer 30 selects one machine learning model M-j to be used for the determination of the target out of machine learning models included in the machine learning model M, which are each denoted by M-i (i=1, 2 ... N: N is the number of the models), that is, an example of the case in which retry is executed, but the present invention is not limited thereto. The image processing computer 30 may execute determination based on the template matching and determination based on the machine learning model M in parallel, and select a result determined as being appropriate as a result of determination of the target.

Referring back to FIG. 14, the description of the processing of moving the needle 18 is continued.

Step S540: The control computer 22 moves the needle 18 to the detected pick-up position.

With the completion of the steps described above, the control computer 22 ends the processing of moving the needle 18.

Referring back to FIG. 13, the description of the sample piece pick-up step is continued.

Step S60: The control computer 22 connects the needle 18 and the sample piece Q. The control computer 22 uses a deposition film for the connection.

Figure 30:
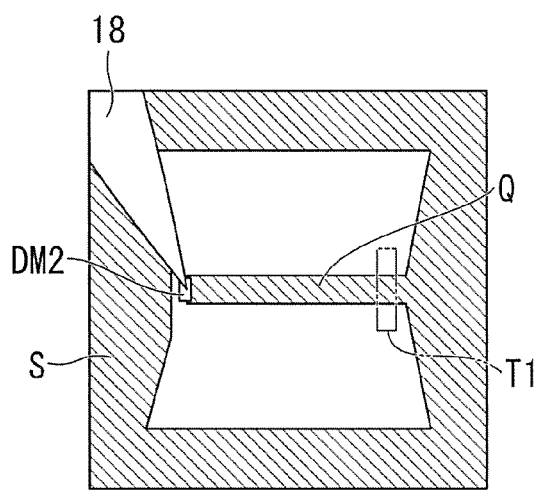
FIG. 30 is a diagram for illustrating a cutting processing position at which a sample and a support portion of a sample piece are cut in SIM image data in the first embodiment of the present invention.

Step S70: The control computer 22 separates the sample S and the sample piece Q by processing. FIG. 30 is an illustration of how the separation by processing is performed, and is a diagram for illustrating a cutting processing position T1 at which the sample S and the support portion Qa of the sample piece Q are cut in SIM image data in the first embodiment of the present invention.

Step S80: The control computer 22 evacuates the needle 18. The control computer 22 detects the position of the tip of the needle 18 in the same manner as in the processing of moving the needle 18 of Step S50, to move and evacuate the needle 18.

Step S90: The control computer 22 moves the sample stage 12. The control computer 22 controls the stage driving mechanism 13 to move the sample stage 12 so that the specific pillar-like portion 44, which has been registered in Step S20 described above, enters an observation field area covered by a charged particle beam.

(Sample Piece Mounting Step)

Figure 31:
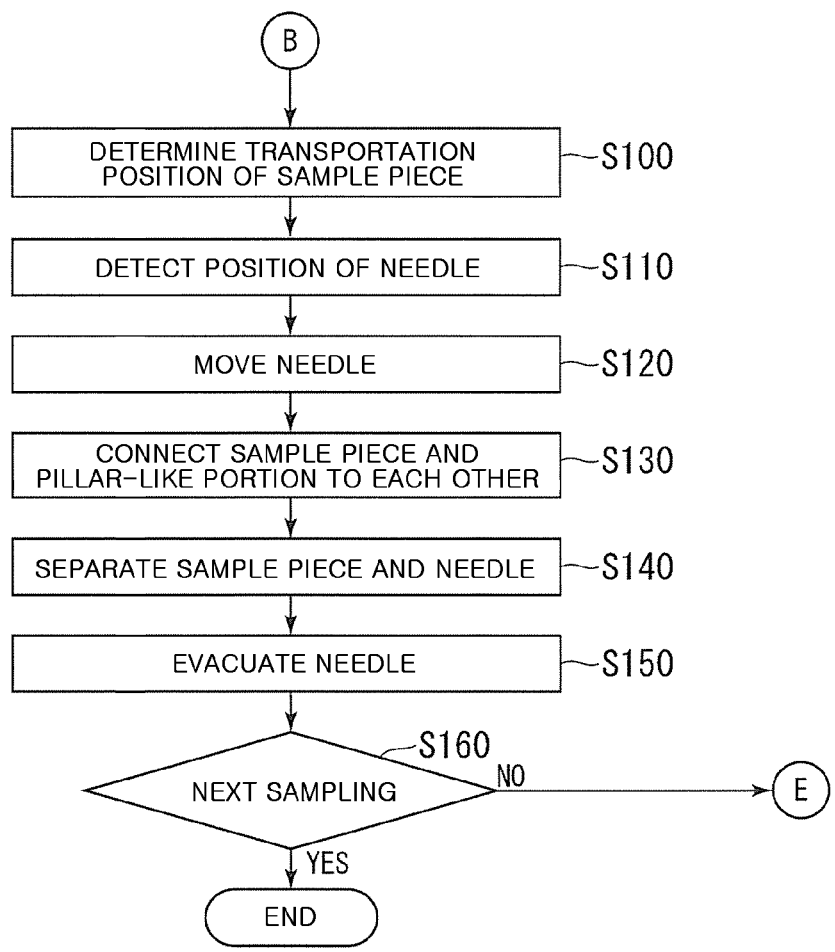
FIG. 31 is a diagram for illustrating an example of a sample piece mounting step in the first embodiment of the present invention.

FIG. 31 is a diagram for illustrating an example of the sample piece mounting step in the first embodiment. The sample piece mounting step is a step of transporting the extracted sample piece Q to the sample piece holder P.

Step S100: The control computer 22 determines a transportation position of the sample piece Q. The control computer 22 determines, as the transportation position, the specific pillar-like portion 44 registered in Step S20 described above.

Step S110: The control computer 22 detects the position of the needle 18. The control computer 22 detects the position of the tip of the needle 18 in the same manner as in Step S520 described above.

Step S120: The control computer 22 moves the needle 18. The control computer 22 uses the needle driving mechanism 19 to move the needle 18 to the transportation position of the sample Q that has been determined in Step S100. The control computer 22 stops the needle 18 with a predetermined gap secured between the pillar-like portion 44 and the sample piece Q.

Step S130: The control computer 22 connects, to the pillar-like portion 44, the sample piece Q connected to the needle 18.

Step S140: The control computer 22 separates the needle 18 and the sample piece Q.

The control computer 22 executes the separation by cutting a deposition film DM2, which connects the needle 18 and the sample piece Q.

Step S150: The control computer 22 evacuates the needle 18. The control computer 22 uses the needle driving mechanism 19 to move the needle 18 away from the sample piece Q by a predetermined distance.

Step S160: The control computer 22 determines whether to execute next sampling. The execution of the next sampling is to continue the sampling of the same sample S from a different site. The number of pieces to be sampled is set in advance in the registration of Step S10, and the control computer 22 checks this data to determine whether to execute the next sampling. When it is determined that the next sampling is to be executed, the control computer 22 returns to Step S50 to continue the subsequent steps in the manner described above, to thereby execute the sampling work. When it is determined that the next sampling is not to be executed, on the other hand, the control computer 22 ends the flow of the series of steps of automated MS.

In the first embodiment, an example of a case in which the learning data is a combination of a learning image and information indicating the position of a target in the learning image is described. The learning data, however, is not limited thereto. The learning data may include, other than a learning image, parameter information, which is information indicating the type of a sample, scanning parameters (acceleration voltages and the like of the focused ion beam irradiation optical system 14 and the electron beam irradiation optical system 15), the number of times the needle 18 is used after the execution of the cleaning of the needle 18, whether a foreign material is adhering to the tip of the needle 18, and the like.

In that case, a machine learning model M1 is generated by executing machine learning based on the learning image and the parameter information. The determination unit 304 obtains the parameter information from the control computer 22 in addition to image data of an SIM image and an SEM image, to thereby determine the position of the target in the image based on the image data, the parameter information, and the machine learning model M1.

The parameter information may further include the direction information described above. When the learning data includes the direction information, the machine learning model M1 is generated by learning the relationship between a target and a direction in which the target is viewed (direction defined with the sample stage 12 as a reference), and the determination unit 304 is therefore not required to use the direction information in the determination of the position of the target.

As described above, the computer (in the first embodiment, the control computer 22) performs position control with respect to a second target (in the first embodiment, the pillar-like portions 44, the needle 18, and the sample piece Q), based on the result of position determination in which the image processing computer 30 determines the position of the second target (in the first embodiment, the pillar-like portions 44, the needle 18, and the sample piece Q) based on a machine learning model (in the first embodiment, the machine learning model M1) and on the second information including the second image (in the first embodiment, SIM images and SEM images of the pillar-like portions 44, the needle 18, and the sample piece Q). The image processing computer 30 and the control computer 22 may be integrated into one to be included in the charged particle beam apparatus 10.

Second Embodiment

A second embodiment of the present invention is described below in detail with reference to the drawings.

In the second embodiment, a description is given on a case in which a pseudo image generated to suit the type of a target is used as a learning image, and a machine learning model to be used is selected based on the type of the target.

The charged particle beam apparatus 10 according to the second embodiment is referred to as "charged particle beam apparatus 10a", and the image processing computer 30 in the second embodiment is referred to as "image processing computer 30a".

Figure 32:
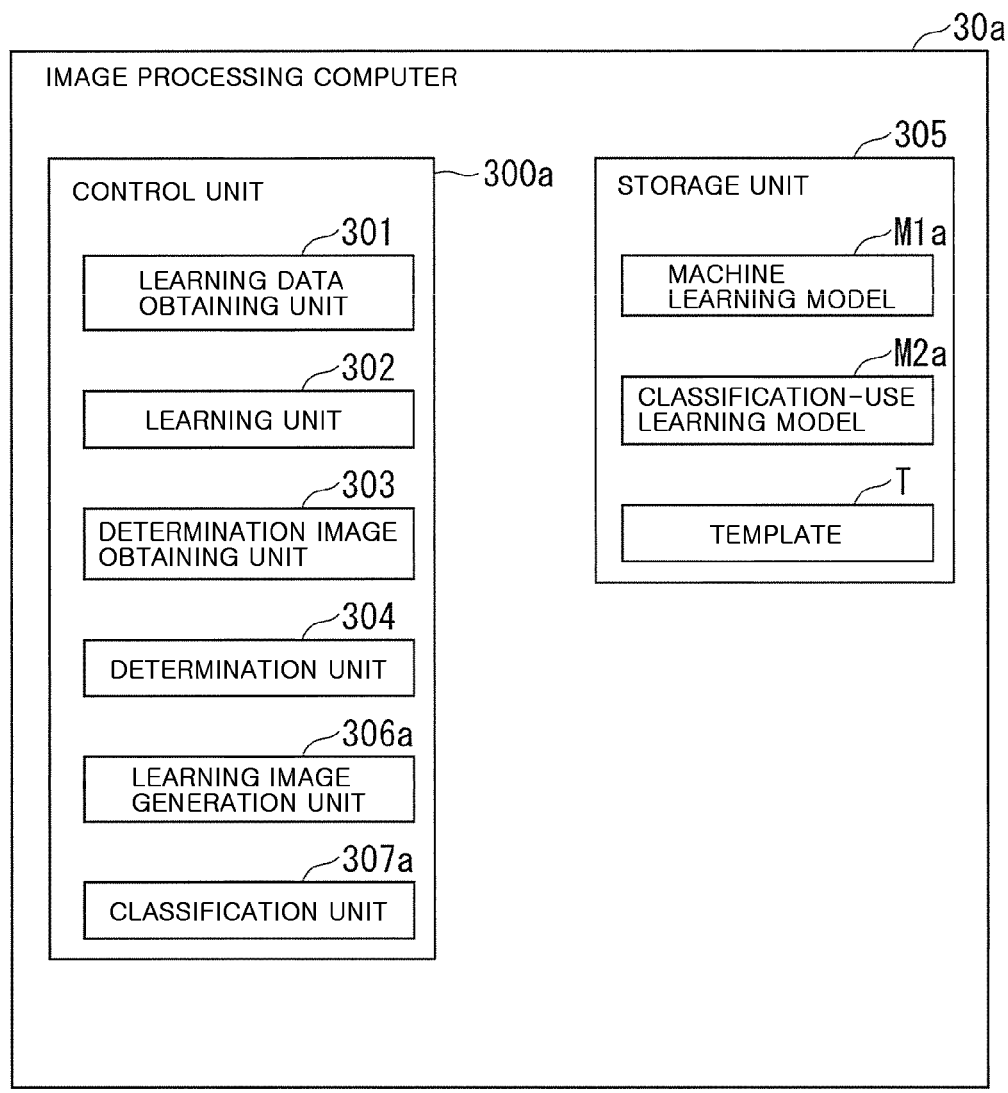
FIG. 32 is a diagram for illustrating an example of a configuration of an image processing computer in a second embodiment of the present invention.

FIG. 32 is a diagram for illustrating an example of a configuration of the image processing computer 30a in the second embodiment. When the image processing computer 30a (FIG. 32) in the second embodiment is compared with the image processing computer 30 (FIG. 6) in the first embodiment, the image processing computer 30a differs in that the image processing computer 30a includes a learning image generation unit 306a, a classification unit 307a, a machine learning model M1a, and a classification-use learning model M2a. Functions of the other components in the second embodiment are the same as those of the components in the first embodiment. Descriptions on the same functions as those in the first embodiment are omitted here, and the description of the second embodiment focuses on differences from the first embodiment.

A control unit 300a includes, in addition to the learning data obtaining unit 301, the learning unit 302, the determination image obtaining unit 303, and the determination unit 304, the learning image generation unit 306a and the classification unit 307a.

The learning image generation unit 306a generates a pseudo image PI as a learning image. In the second embodiment, the pseudo image PI is an image generated from an SIM image and an SEM image that are obtained in advance by irradiating a target with a charged particle beam. The learning image generation unit 306a generates the pseudo image PI based on, for example, bare ware BW and a pattern image PT.

The bare ware BW is an image in which a surface pattern of a target is removed to indicate the shape of the target. The bare ware BW is preferred to be a plurality of images that differ from one another in size, contrast, focus, or the like and that indicate a plurality of target shapes. The bare ware BW is an image drawn with the use of image software, unlike SIM images and SEM images.

The pattern image PT is an image that indicates a pattern corresponding to the internal structure of a target. The pattern image PT may be an SIM image or an SEM image that is obtained by irradiation with a charged particle beam, or an image drawn with the use of image software.

The learning image generation unit 306a generates the pseudo image PI with the use of a pseudo image generation algorithm, by adding a random noise to a pattern that is indicated by the pattern image PT and that corresponds to the internal structure of a target, and superimposing the pattern on the bare ware BW.

In the second embodiment, an example of a case in which the learning image generation unit 306a generates the pseudo image PI as a learning image of the sample piece Q is described, but the second embodiment is not limited thereto. The learning image generation unit 306a may generate the pseudo image PI as a learning image of the needle 18 or of the pillar-like portions 44. The learning image generation unit 306a may also generate the pseudo image PI for a case in which a part of the sample piece Q adheres to the tip of the needle 18, as a learning image for the abnormal case described above.

The learning image generation unit 306a may include, in the learning image, the SIM image and the SEM image in the first embodiment, which are obtained in advance by irradiating the target with a charged particle beam as described above. That is, the learning image generation unit 306a may use the pseudo image PI alone or may use the pseudo image PI in combination with the SIM image and the SEM image, as the learning image.

The learning unit 302 generates the machine learning model M1a in the machine learning by extracting, as feature amounts, the surface shape of the target and the pattern of the internal structure of the target from the learning image that has been generated by the learning image generation unit 306a.

A method of generating the pseudo image PI is described with reference to FIG. 33 to FIG. 35.

Figure 33:
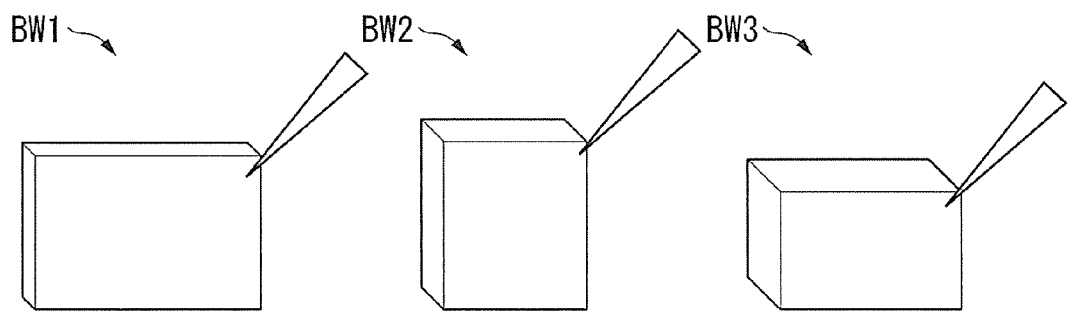
FIG. 33 is a diagram for illustrating an example of bare ware in the second embodiment of the present invention.

FIG. 33 is a diagram for illustrating an example of the bare ware BW in the second embodiment. In FIG. 33, bare ware BW1, bare ware BW2, and bare ware BW3 are illustrated as the bare ware BW of the sample piece Q. The bare ware BW1, the bare ware BW2, and the bare ware BW3 are images in which shapes of the sample piece Q in a plurality of sizes are simulated. An image corresponding to the needle 18 is included in each of the bare ware BW1, the bare ware BW2, and the bare ware BW3 as information indicating the pick-up position.

Figure 34:
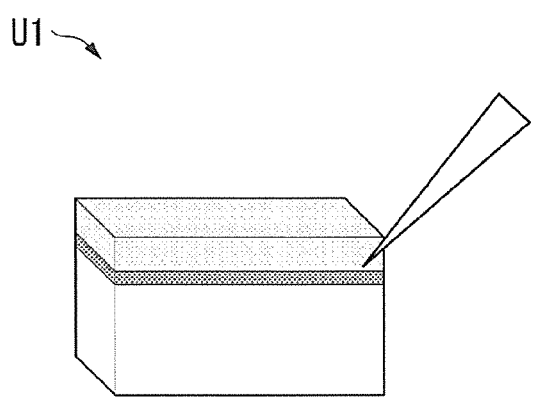
FIG. 34 is a diagram for illustrating an example of a pattern image in the second embodiment of the present invention.

FIG. 34 is a diagram for illustrating an example of the pattern image PT in the second embodiment. In FIG. 34, a user sample U1 is illustrated as the pattern image PT. The user sample U1 is an image prepared to suit the type of the sample piece Q that is intended by a user of the charged particle beam apparatus 10a to be processed. In the user sample U1, patterns corresponding to the types of materials that form a plurality of layers of a multi-layer sample piece are drawn.

Figure 35:
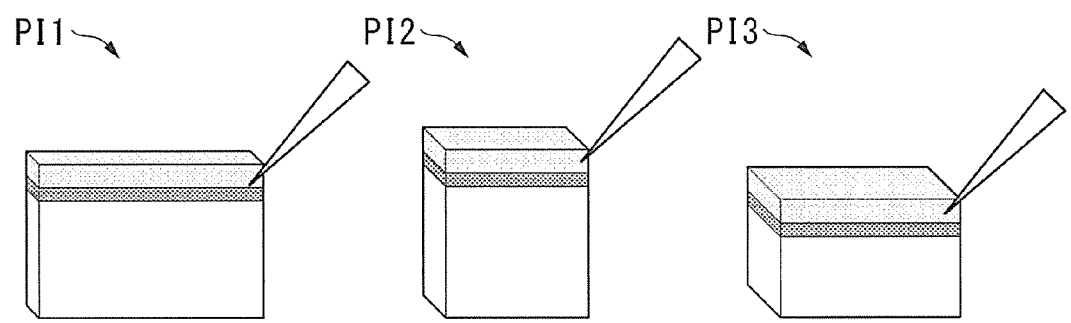
FIG. 35 is a diagram for illustrating an example of pseudo images in the second embodiment of the present invention.

FIG. 35 is a diagram for illustrating an example of the pseudo image PI in the second embodiment. In FIG. 35, a pseudo image PI1, a pseudo image PI2, and a pseudo image PI3, which are generated based on the bare ware BW1, bare ware BW2, and bare ware BW3 of FIG. 33 and on the user sample U1 of FIG. 34, are illustrated as the pseudo image PI. In the pseudo image PI1, the pseudo image PI2, and the pseudo image PI3, the internal structure pattern indicated by the user sample U1 is superimposed on the shapes of the sample piece Q of a plurality of sizes.

Referring back to FIG. 32, the description of the configuration of the image processing computer 30a is continued.

The classification unit 307a classifies a determination image obtained by the determination image obtaining unit 303, based on the classification-use learning model M2a. The classification-use learning model M2a is a model for selecting, from a plurality of models included in the machine learning model M1a, a model to be used for the determination by the determination unit 304 in accordance with the type of a target. The plurality of models included in the machine learning model M1a in that case are distinguished from one another by not only the set of learning data that has been used for generation of the model but also the algorithm of machine learning.

The classification-use learning model M2a associates, for example, for each user, the type of the sample piece Q to be processed, and a model included in the machine learning model M1a. The classification-use learning model M2a is generated in advance based on machine learning, and is stored in the storage unit 305.

Processing of detecting the pick-up position of the sample piece Q is described next with reference to FIG. 36, as the operation of automated MS of the charged particle beam apparatus 10a that uses the classification-use learning model M2a.

Figure 36:
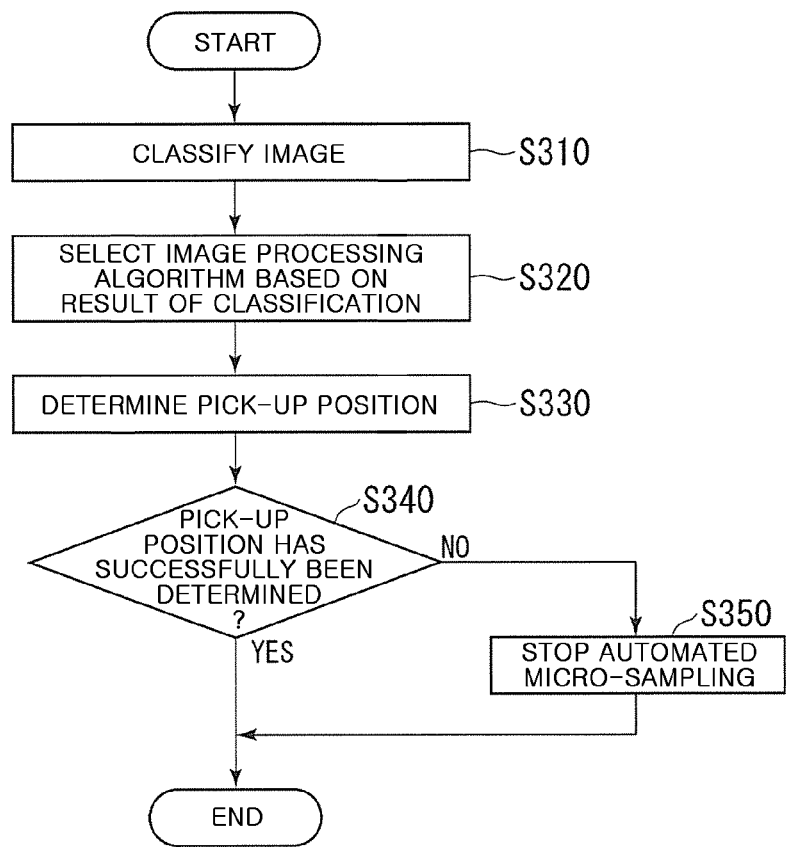
FIG. 36 is a diagram for illustrating an example of processing of detecting a pick-up position in the second embodiment of the present invention.

FIG. 36 is a diagram for illustrating an example of the processing of detecting the pick-up position in the second embodiment.

Step S310: The classification unit 307a classifies a determination image obtained by the determination image obtaining unit 303, based on the classification-use learning model M2a.

Step S320: The classification unit 307a selects, based on the result of the classification, a machine learning model to be used for the determination by the determination unit 304 from a plurality of models included in the machine learning model M1a. The classification unit 307a may select, based on the result of the classification, template matching as an algorithm to be used by the determination unit 304 for the determination.

Step S330: The determination unit 304 determines the pick-up position of the sample piece Q that is included in the determination image obtained by the determination image obtaining unit 303, based on the machine learning model selected by the classification unit 307a. In Step S330, the determination unit 304 executes the pick-up position determination processing of FIG. 23 described above.

The classification by the classification unit 307a is an example of third determination for selecting the type of determination. In place of the template matching of Step S5310 of FIG. 23, determination based on machine learning may be executed with the use of one of the plurality of models included in the machine learning model M1a. The classification unit 307a therefore selects a determination type (an algorithm) for at least one of the first determination (for example, the determination in Step S5310) or the second determination (for example, the determination in Step S5340), based on the result of the third determination for selecting a determination type (an algorithm).

Step S340: The determination unit 304 determines whether the pick-up position of the sample piece Q has successfully been determined. When it is determined that the pick-up position has successfully been determined (Step S340: YES), the determination unit 304 outputs the position information indicating the determined pick-up position to the control computer 22, and ends the pick-up position determination processing. When it is determined that the pick-up position has not successfully been determined (Step S340: NO), on the other hand, the determination unit 304 executes processing of Step S350.

Step S350: The determination unit 304 causes the control computer 22 to stop automated MS. The determination unit 304 outputs a stop signal for stopping automated MS to the control computer 22. The determination unit 304 then ends the pick-up position determination processing.

The embodiments described above deal with an example of the case in which the determination unit 304 executes the second determination when the first determination fails in the determination of the position of a target. However, the present invention is not limited thereto. The determination unit 304 may execute the second determination even after successful first determination to determine the position of the target based on both of the result of the first determination and the result of the second determination.

For instance, the determination unit 304 may determine the position of a target based on template matching, subsequently determine the position of the target based on machine learning, and, when positions indicated by the results of the former determination and the latter determination match, determine that the position indicated by the determination results as the position of the target.

The determination unit 304 may execute fourth determination so that the position of the target is controlled based on the result of the fourth determination, which is selected based on at least one of the result of the first determination or the result of the second determination. A specific example of this case is described below.

For example, the determination unit 304 may select a determination method for the next time the position of a target is determined, based on the result of the determination executed last time. When the selection of a determination method for the next time the position of a target is determined is to be based on the result of the determination executed last time, the determination unit 304 may check the result of the first determination executed last time and the result of the second determination executed last time to find out, for example, that the first determination is lower in precision than the second determination. The determination unit 304 in this case may execute the second determination first in the next determination.

The determination unit 304 may also select a determination type to be used as the type of the first determination or the second determination that is executed next time, based on the type of the determination executed last time.

The determination unit 304 may select the type of the first determination to be used as the type of determination executed next time based on the result of the second determination, which is executed depending on the result of the first determination of the last time. For instance, the determination unit 304 may select the type of a template to be used in template matching based on the precision of machine learning-based determination, which is executed when template matching fails.

The determination unit 304 may select the type of the second determination to be used as the type of determination executed next time based on the result of the second determination of the last time. For instance, the determination unit 304 may continuously use one type out of types of the second determination until the precision of the second determination drops to a predetermined value or lower in the subsequent rounds of determination and, when the precision of the second determination drops to a predetermined value or lower, change the type of the second determination. In this case, the determination unit 304 may continuously use, for example, one model out of a plurality of models of machine learning until the precision of determination based on this model drops to a predetermined value or lower in the subsequent rounds of determination, and change the machine learning model when the precision of determination based on this model drops to the predetermined value or lower.

The position of a target may thus be controlled based on: the result of the fourth determination that is selected by the determination unit 304 based on at least one of the result of the first determination or the result of the second determination; and information that includes an image obtained by irradiation with a charged particle beam.

In the processing of detecting the pick-up position illustrated in FIG. 36, a description is given of an example of the case in which, in Step S320, the machine learning model to be used for the determination is selected from the plurality of models included in the machine learning model M1a based on the result of the classification of the determination image, but the present invention is not limited thereto. The machine learning model to be used for the determination may be selected based on a score calculated for the result of the classification of the determination image.

For example, after classifying the determination image obtained by the determination image obtaining unit 303 based on the classification-use learning model M2a, the classification unit 307a calculates a score (referred to as "classification score") for the result of the classification. The classification unit 307a calculates the score by, for example, calculating a posterior probability for the result of the classification. The classification unit 307a calculates the classification score as a numerical value having a value in a predetermined range of, for example, from 0 points to 100 points. When the calculated classification score is equal to or more than a predetermined value, the classification unit 307a selects, based on the result of the classification, the machine learning model to be used for the determination by the determination unit 304 from the plurality of models included in the machine learning model M1a.

When the calculated classification score is less than the predetermined value, on the other hand, the classification unit 307a selects, in addition to the machine learning model based on the result of the classification, a machine learning model corresponding to a classification similar to the result of the classification, from the plurality of models included in the machine learning model M1a. That is, the classification unit 307a selects a plurality of machine learning models from the plurality of models included in the machine learning model M1a. The determination unit 304 determines, based on the plurality of machine learning models selected by the classification unit 307a, the position of the target included in the determination image for each of the plurality of machine learning models. The determination unit 304 compares the results of the determination with one another among the plurality of machine learning models. The determination unit 304 calculates, for example, a score (referred to as "position determination score") for each of the results of the determination, and selects a result having the highest position determination score as a result of the determination of the position of the target. The position determination score is a score for the determination of the position of the target based on the machine learning model M.

A threshold value of the position determination score may be set in advance for the determination of the position of the target by the determination unit 304. The threshold value of the position determination score is set in advance by the user of the charged particle beam apparatus 10 at timing before the determination unit 304 determines the position of the target. In this case, when determining whether the position of the target has successfully been determined, the determination unit 304 determines, in addition to whether the position of the target has successfully been determined, whether the position determination score is equal to or more than the threshold value. When it is determined that the position of the target has successfully been determined, and when the position determination score is equal to or more than the threshold value, the determination unit 304 determines that the position of the target has successfully been determined. Even in the case where it is determined that the position of the target has successfully been determined, when the position determination score is not equal to or more than the threshold value, the determination unit 304 determines that the position of the target has not successfully been determined.

When it is known in advance that the position of the target is included in a certain range, the range of the coordinates indicating the position of the target in the result of the determination of the position of the target may be limited. The range of the coordinates is set in advance by the user of the charged particle beam apparatus 10 at timing before the determination unit 304 determines the position of the target. In this case, in the case of determining whether the position of the target has successfully been determined, only when it is determined that the position of the target has successfully been determined, the position determination score is equal to or more than the threshold value, and the coordinates indicating the position of the target are within the range set in advance, the determination unit 304 determines that the position of the target has successfully been determined. Even in a case where it is determined that the position of the target has successfully been determined, when the position determination score is less than the threshold value or when the coordinates indicating the position of the target are outside the range set in advance, the determination unit 304 determines that the position of the target has not successfully been determined.

The embodiments described above deal with an example of a case in which the charged particle beam apparatus 10 or 10a includes two charged particle beam irradiation optical systems, namely, the focused ion beam irradiation optical system 14 and the electron beam irradiation optical system 15. However, the present invention is not limited thereto.

The charged particle beam apparatus may include one charged particle beam irradiation optical system. In that case, a determination image obtained by irradiation with a charged particle beam from the charged particle beam irradiation optical system is preferred to include, for example, a shadow of a target in addition to the target. The target in this case is the needle 18.

The shadow of the needle 18 is a phenomenon that occurs when the needle 18 approaches a surface of the sample piece Q in observation from a tilt direction with the tilt of a predetermined angle with respect to the vertical direction of the sample stage 12, because the approaching needle 18 blocks the arrival of secondary electrons (or secondary ions) generated from a part of the surface of the sample piece Q that is close to the needle 18 at the detector 16. The phenomenon is more prominent when the distance between the needle 18 and the surface of the sample piece Q is closer. The shadow in the determination image accordingly has a higher luminance value when the distance between the needle 18 and the surface of the sample piece Q is closer.

The image processing computer 30 performs calculation of the distance between the tip of the needle 18 and the surface of the sample piece Q based on the luminance value of the shadow of the needle 18 in addition to the determination in which, from the determination image, the position of the tip of the needle 18 is determined in the form of two-dimensional coordinates in the determination image. The image processing computer 30 thus determines, from the determination image, the position of the tip of the needle 18 in the form of values of three-dimensional coordinates.

The control computer 22 and some components of the image processing computer 30 or 30a, for example, the learning data obtaining unit 301, the learning unit 302, the determination image obtaining unit 303, the determination unit 304, the learning image generation unit 306a, and the classification unit 307a, in the embodiments described above may be implemented by a computer. In that case, a control function thereof may be implemented by recording a program for implementing the control function in a computer-readable recording medium, and reading and executing the program that is recorded in the recording medium on a computer system. The "computer system" used herein is a computer system built in the control computer 22 or the image processing computer 30 or 30a, and includes an OS as well as peripheral devices and other types of hardware. The "computer-readable recording medium" refers to a portable medium, for example, a flexible disk, a magneto-optical disc, a ROM, or a CD-ROM, or a storage device built in the computer system, for example, a hard disk. Examples of the "computer-readable recording medium" may also include an element configured to dynamically hold the program for a short time, as in a communication line used when the program is transmitted via the Internet or other networks or a phone line or other communication links, and an element configured to hold the program for a fixed length of time, as in a volatile memory inside a computer system that serves as a server or a client in that case. The program described above may be designed so that only some of the described functions are implemented by the program, or so that the program is combined with another program already recorded in the computer system to implement the described functions.

The control computer 22 and some or all of the components of the image processing computer 30 or 30a in the embodiments described above may be implemented as a large scale integration (LSI) circuit or a similar integrated circuit. The control computer 22 and the function blocks of the image processing computer 30 or 30a may be configured as individual processors, or some or all thereof may be integrated to be configured as one processor. An integrated circuit to be used for the implementation is not limited to LSI, and a dedicated circuit or a general-purpose processor may be used. When a technology for integration into an integrated circuit that substitutes for LSI appears due to advancement in semiconductor technology, an integrated circuit obtained by this technology may be used.

While a detailed description has been given above on at least one embodiment of the present invention with reference to the drawings, the concrete configuration of the present invention is not limited to the ones described above, and various design modifications and the like can be made without departing from the spirit of the present invention.

What is claimed is:

1. A charged particle beam apparatus, which is configured to automatically fabricate a sample piece from a sample, the charged particle beam apparatus comprising:
    a charged particle beam irradiation optical system configured to radiate a charged particle beam;
    a sample stage configured to move the sample that is placed on the sample stage;
    a sample piece transportation unit configured to hold and convey the sample piece separated and extracted from the sample;
    a holder fixing base configured to hold a sample piece holder to which the sample piece is transported; and
    a computer configured to determine a position of a target that is included in an image obtained by irradiation with the charged particle beam and perform control of the position of the target, based on the position that is determined:
    wherein the computer, in order to determine the position of the target, initially executes any one of a first determination or a second determination that is different from the first determination, determines the position of the target based on a result of the other one of the first determination or the second determination which is executed depending on a result of the one of the first determination or the second determination that is initially executed, and performs the control of the position based on the position that is determined,
    the first determination determines the position of the target based on template matching that uses a template about the target, and
    the second determination determines the position of the target based on a model of machine learning in which a result of pre-executed machine learning with regard to the position of the target included in the image is stored.

2. The charged particle beam apparatus according to claim 1, wherein the computer is configured to select a type of algorithm for executing the first determination or the second determination when executing the first determination or the second determination in order to determine the position of the target.

3. The charged particle beam apparatus according to claim 1, wherein the computer is configured to, in order to perform control of the position of the target, select a type of determination for a subsequent determination of the position of the target or an algorithm to be used for executing the type of determination, based on a result of prior execution of the first determination or the second determination.

* * * * *